(12) United States Patent
Tanaka

(10) Patent No.: US 8,357,955 B2
(45) Date of Patent: Jan. 22, 2013

(54) SEMICONDUCTOR INTEGRATED CIRCUIT

(75) Inventor: Yoshinori Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 377 days.

(21) Appl. No.: 12/805,158

(22) Filed: Jul. 15, 2010

(65) Prior Publication Data

US 2011/0049575 A1 Mar. 3, 2011

(30) Foreign Application Priority Data

Aug. 28, 2009 (JP) ................................ 2009-198547

(51) Int. Cl.
*H01L 27/06* (2006.01)
(52) U.S. Cl. ................ 257/206; 257/E27.014; 326/103
(58) Field of Classification Search .................. 257/206, 257/369, 390, 391, 401, 773, 776, E23.07, 257/E23.071, E27.013, E27.014, E27.015, 257/E27.016, E27.017; 326/103; 365/189.15, 365/189.16, 189.17; 438/128, 129
See application file for complete search history.

(56) References Cited

U.S. PATENT DOCUMENTS 5,598,347 A * 1/1997 Iwasaki ..................... 365/182

FOREIGN PATENT DOCUMENTS

JP 10-173055 6/1998

* cited by examiner

*Primary Examiner* — Julio J Maldonado
*Assistant Examiner* — Daniel Shook
(74) *Attorney, Agent, or Firm* — Rader Fishman & Grauer, PLLC

(57) ABSTRACT

Disclosed herein is a semiconductor integrated circuit, wherein a desired circuit is formed by combining and laying out a plurality of standard cells and connecting the cells together, of which the cell length, i.e., the gap between a pair of opposed sides, is standardized, the plurality of standard cells forming the desired circuit include complementary in-phase driven standard cells, each of which includes a plurality of complementary transistor pairs that are complementary in conductivity type to each other and have their gate electrodes connected together, and N ($\geq$2) pairs of all the complementary transistor pairs are driven in phase, and the size of the standardized cell length of the complementary in-phase driven standard cell is defined as an M-fold cell length which is M (N$\geq$M$\geq$2) times the basic cell length which is appropriate to the single complementary transistor pair.

8 Claims, 17 Drawing Sheets

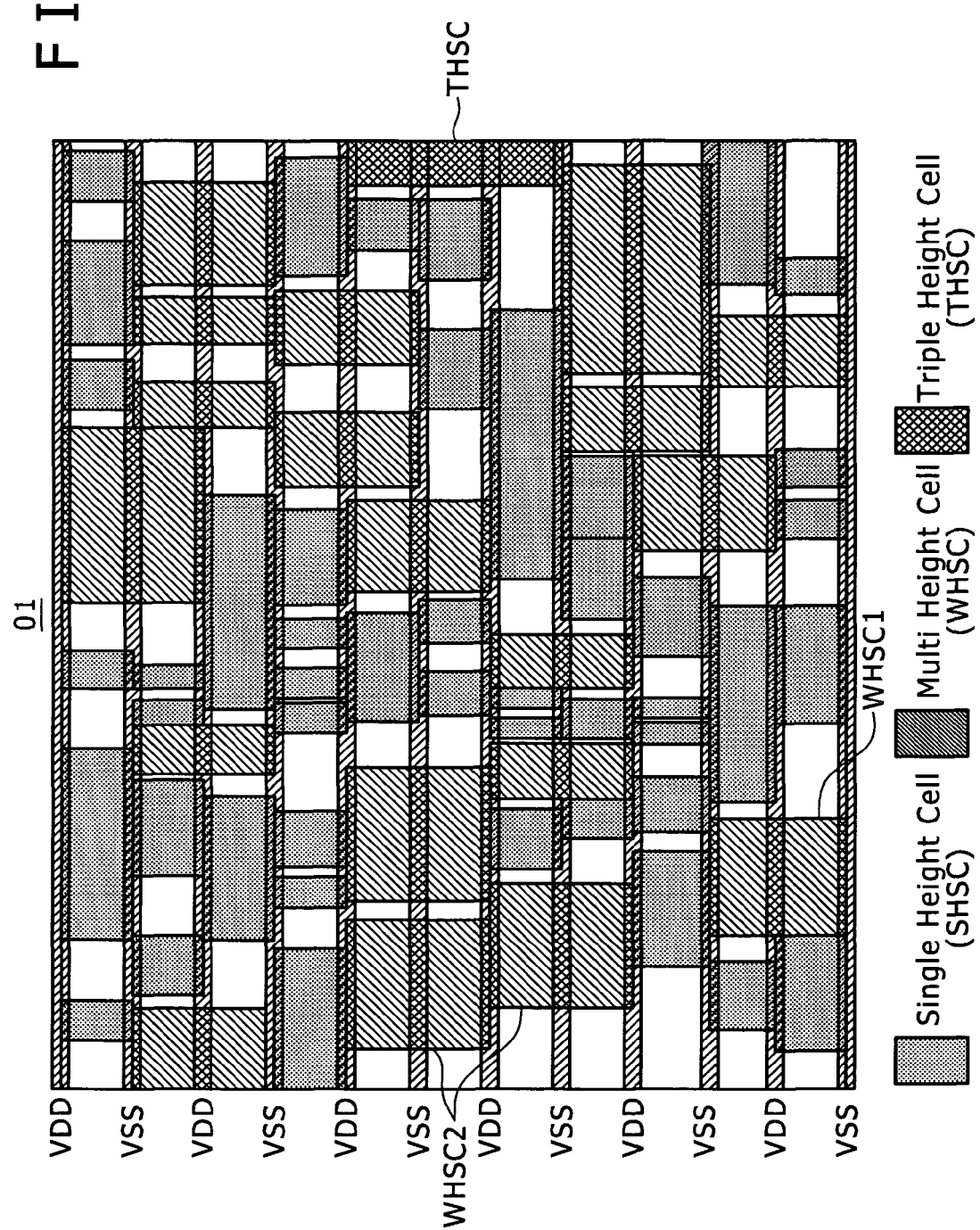

SEMICONDUCTOR INTEGRATED CIRCUIT

BACKGROUND OF THE INVENTION

1. Field of the Invention

The present invention relates to a semiconductor integrated circuit having a desired circuit formed by combining and laying out a plurality of standard cells each having transistors and gate electrodes and connecting the cells together.

2. Description of the Related Art

In a common standard cell, at least one of the sizes thereof in the directions orthogonal to each other (so-called vertical and horizontal directions) is standardized to a few types or, for example, to three types. The so-called vertical size is referred to as the height of the standard cell. This height is standardized to three types or so. Here, in order to avoid confusion between this cell size (height) and its structural height perpendicular to the semiconductor substrate, the cell size will not be called the "height." Instead, this size will be referred to as the "standard cell length" for the sake of convenience.

Even when a few standard lengths of the standard cell may be used in an LSI (Large Scale Integration) as a whole, the same standard length is used when viewed locally as in the same circuit block to ensure efficient layout of cells.

Therefore, various types of standard cells with the same standard cell length are made available and registered in a library. In general, standard cell patterns such as internal wiring patterns are limited in layout space along the standard cell length.

In contrast, the standard cell size in the direction orthogonal to the common cell length (so-called horizontal direction) is available in a variety of lengths according to the scale of the gate circuit. The cell size in the direction orthogonal to the common cell length will be hereinafter referred to as the "arbitrary cell length" for the sake of convenience.

The inverter is normally the most basic building block of logic circuits achieved by the standard cell system. The inverter is formed by connecting NMOS and PMOS transistors in series between VDD and VSS lines so that the gates are shared. In the most basic standard cell used for logic circuits, the distance between the center of the VDD line and that of the VSS line is the standard cell length, and the direction along the VDD and VSS lines is the arbitrary cell length direction when the VDD and VSS lines are arranged alternately and parallel to each other. This most basic standard cell is designed by increasing or reducing the size of the arbitrary cell length as appropriate according to the scale of the standard cell circuit. Such a basic standard cell has a standard cell length of a CMOS pair that is appropriate to the sum of the lengths of NMOS and PMOS gates. Such a standard cell has a height appropriate to that of a single CMOS pair. Therefore, this cell will be hereinafter referred to as a "single height cell."

The layout of standard cells each having a standard cell length of a CMOS pair is described, for example, in Japanese Patent Laid-Open No. Hei 10-173055.

SUMMARY OF THE INVENTION

There would be no problems if the circuit to be achieved with a standard cell was a basic logic gate circuit such as an inverter or a NAND circuit. However, there are cases in which the single height configuration is not suitable depending on the circuit scale.

We assume, for example, that there is a standard cell configured in such a manner that the gates of a number of CMOS pairs must be driven in phase.

In this standard cell, the PMOS and NMOS transistor gates in each CMOS pair are connected by a gate line made, for example, of polysilicon. However, several gate lines must be further shorted together. Therefore, the gate lines are connected together by upper layer wirings (normally, metal wirings in the first layer). However, a number of other internal wirings are also required in the standard cell to connect transistor gates to the sources or drains of other transistors. As a result, it may be impossible to secure a space to connect the gates together with the upper layer wirings.

Even if a space is secured, it may be necessary to design wirings that are bent in a complex manner, thus resulting in reduced workability for design and mask preparation and leading to higher cost.

If a space cannot be secured, there is no alternative but to increase the standard cell length in the standard cell specification to provide more leeway or use the wirings in a higher layer.

However, increasing the standard cell length leads to waste in areas other than the CMOS pairs of the cell and small-scale basic circuitry such as inverters. Moreover, using the wirings in a higher layer (e.g., wirings in the second metal wiring layer) clutters the space where other wirings are supposed to be formed in the second metal wiring layer.

It is desirable to provide a semiconductor integrated circuit having a cell layout unlikely to produce wasted space and advantageous in terms of cost when the semiconductor integrated circuit contains standard cells for achieving a circuit adapted to drive a plurality of complementary transistor pairs (e.g., CMOS pairs) in phase.

In a semiconductor integrated circuit according to an embodiment of the present invention, a desired circuit is formed by combining and laying out a plurality of standard cells and connecting the cells together. The cell length, i.e., the gap between a pair of opposed sides, of the standard cells is standardized. These standard cells include a complementary in-phase driven standard cell. Each of the complementary in-phase driven standard cell includes a plurality of complementary transistor pairs that are complementary in conductivity type to each other and have their gate electrodes connected together. N ($\geq 2$) pairs of all the complementary transistor pairs are driven in phase. Further, the size of the standardized cell length of a complementary in-phase driven standard cell is defined as an M-fold cell length which is M ($N \geq M \geq 2$) times the basic cell length which is appropriate to the single complementary transistor pair. In a complementary in-phase driven standard cell, the common gate electrodes of at least M pairs of the N complementary transistor pairs to be driven in phase are arranged linearly in the direction of the M-fold cell length.

In the embodiment of the present invention, single height cells or standard cells having the basic cell length and multi-height cells or the complementary in-phase driven standard cells having the M-fold cell length, are preferably arranged adjacent to each other to form the desired circuit. Further, when arranged adjacent to the single height cells, the multi-height cells preferably have a power line arrangement structure that allows for power lines to be shared.

In the above configuration of the semiconductor integrated circuit according to the embodiment of the present invention, if electrical shorting is required for in-phase driving, the gate electrodes of a plurality of complementary transistor pairs to be driven in phase are formed integrally with a common gate line itself. This provides a reduced number of internal wirings required to short the gate lines, thus eliminating wasted space. Further, this eliminates the need to form internal wirings in complex shapes.

The above preferable configuration does not impede the advantages of the standard cell layout system because the multi-height cells preferably have a power line sharing structure with the adjacent single height cells. At this time, the single height cells need only have a required minimum basic cell length suitable for a small-scale circuit. The standard cell length of the multi-height cell is a plurality of times the basic cell length thereof. This makes it possible to secure a power line sharing structure with other surrounding cells even if the standard cell length of the multi-height cell is increased. Further, in this case, the single height cell has a required minimum basic cell length suitable for a small-scale circuit, thus eliminating wasted space.

The present invention provides a semiconductor integrated circuit having a cell layout unlikely to produce wasted space and advantageous in terms of cost when the semiconductor integrated circuit contains standard cells for achieving a circuit adapted to drive a plurality of complementary transistor pairs (e.g., CMOS pairs) in phase.

BRIEF DESCRIPTION OF THE DRAWINGS

FIG. 1 is a diagram schematically illustrating a plan view of an integrated circuit according to first to third embodiments with a focus on the cell layout;

DETAILED DESCRIPTION OF THE PREFERRED EMBODIMENTS

Figure 2A:
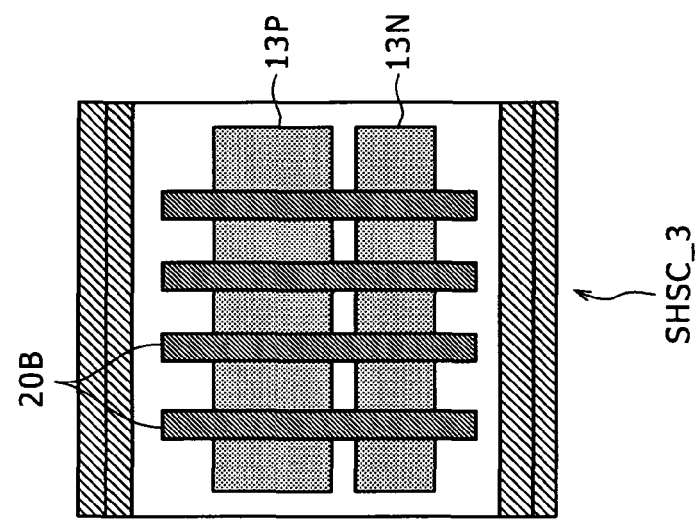
FIGS. 2A to 2C are layout diagrams for describing the inconveniences of a single height layout technique.

A description will be given below of embodiments of the present invention with reference to the accompanying drawings by taking, as main examples, double height and triple height circuit cells.

1. First embodiment: Embodiment in which the double height cell to which the present invention is applied is shown by four application examples (circuit examples). In the first and second application examples, the effect obtained by the application of the present invention will be described by using comparative examples 1 and 2.

2. Second embodiment: Embodiment of a triple height cell to which the present invention is applied.

3. Third embodiment: Embodiment of an L-shaped cell (double height cell having the same functionality as a triple height cell) to which the present invention is applied.

4. Modification examples: Two modification examples relating to a substrate contact will be described.

1. First Embodiment

1. Overall Layout

FIG. 1 is a diagram schematically illustrating a plan view of an integrated circuit according to embodiments with a focus on the cell layout.

In FIG. 1, each of rectangular areas is called a cell. The cells denoted by reference numeral SC are standard cells. The standard cell SC is a predesigned and standardized functional circuit cell registered in a library such as an inverter or a NAND gate. Although being a collection of data, the standard cell SC may refer to part of a device manufactured based on the data. Although a detailed description will be given later, standard cells registered in a library are combined and laid out in the design phase of a semiconductor integrated circuit. As a result of the layout, source voltage lines and reference voltage lines (e.g., GND lines) are roughly connected together on data. Connecting signal and other lines after the layout provides the desired circuit. The layout of cells and disposition of wirings up to this point is conducted on the data level using a design support apparatus.

Although being a schematic plan view of the semiconductor integrated circuit with a focus on the cell layout, FIG. 1 can also serve as a data-level cell layout diagram.

In a semiconductor integrated circuit 1 shown in FIG. 1, the standard cells SC of a variety of sizes are combined and laid out, thus achieving a desired circuit. Here, the desired circuit can be achieved at will depending on what the functional circuits of the standard cells SC are and how the cells are combined so long as the desired circuit is a logic circuit. FIG. 1 is a generalized diagram, and it is arbitrary what the desired circuit is.

The standard cell design system is used in the design process of ASIC (Application Specific Integrated Circuit) and ASSP (Application Specific Standard Product). ASIC is an IC developed and manufactured to meet a specific application requirement of each customer. ASSP is an IC designed and developed as a general-purpose part for a plurality of customers.

A description will be given below of the size of the standard cell SC.

In the standard cell SC, the cell length in the direction along one of two sides that are orthogonal to each other is commonly standardized. This cell length direction will be hereinafter referred to as the "standard cell length direction." There may not be only one, but a few sizes or, for example, three sizes, in the standard cell length direction (standard cell lengths) in an entire IC. It should be noted, however, that there has been, up until today, one unified standard cell length, when viewed locally, as in a single circuit block or a circuit adapted to achieve a desired function. One of the major characteristics of the embodiments of the present invention is that there are a plurality of standard cell lengths in a local circuit such as a single circuit block or a circuit adapted to achieve a desired function.

In relation to this characteristic, common single height standard cells SHSC and multi-height standard cells MHSC, both serving as the standard cells SC, are mixed in the example shown in FIG. 1. Here, two types of multi-height standard cells MHSC are shown, a double height standard cell WHSC having a standard cell length twice that of a single height standard cell SHSC and a triple height standard cell THSC having a standard cell length that is three times that of a single height standard cell SHSC.

The cell size can be determined at will in the direction orthogonal to the standard cell length direction. Although the cell size may be determined at will, it is common that there are fixed discrete sizes that can be used (specified by the grid number) for reasons of design efficiency or to meet the demand for consistency. The direction orthogonal to the standard cell length direction will be hereinafter referred to as the "arbitrary cell length direction."

In a circuit block as shown in FIG. 1, the VDD and VSS lines extend in the arbitrary cell length direction and are arranged alternately in the standard cell length direction. The gap between the VDD and VSS lines is appropriate to the height of the single height standard cell SHSC.

Further, the double height standard cell WHSC includes a type denoted by reference numeral WHSC1. The double height standard cell WHSC1 has the two VSS lines that are disposed, one along each of the two short sides, in the standard cell length direction, with the VDD line passing through the same cell WHSC1 at the center between the two VSS lines. Further, the double height standard cell WHSC includes a type denoted by reference numeral WHSC2. In contrast to the double height standard cell WHSC1, the double height standard cell WHSC2 has the two VDD lines that are disposed, one along each of the two short sides, with the VSS line passing through the same cell WHSC2 at the center between the two VDD lines. Although only one of these two types may be used, the two types are mixed here from the viewpoint of layout efficiency.

[Single Height Layout]

Next, the reason will be clarified why the single height standard cells SHSC and multi-height standard cells MHSC are mixed in the same circuit block by stating the disadvantages of the major techniques adapted to design a semiconductor integrated circuit with only single height cells.

Figure 2B:
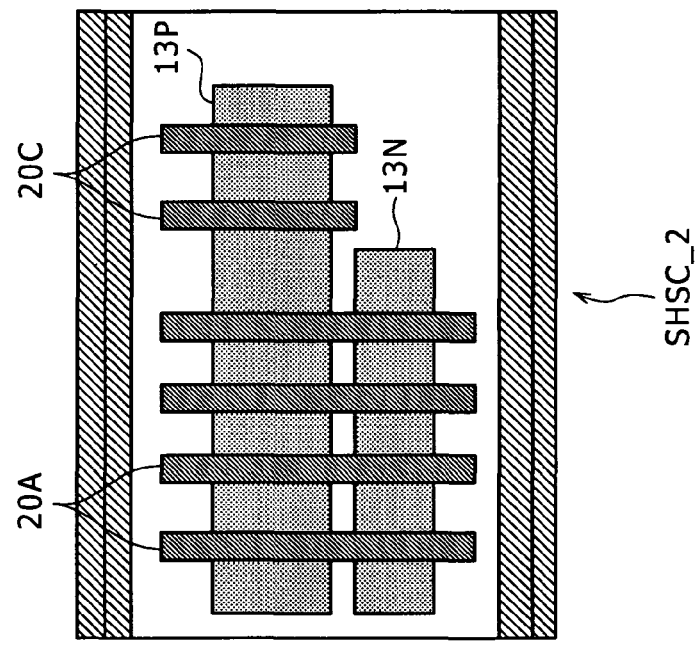
Figure 2C:
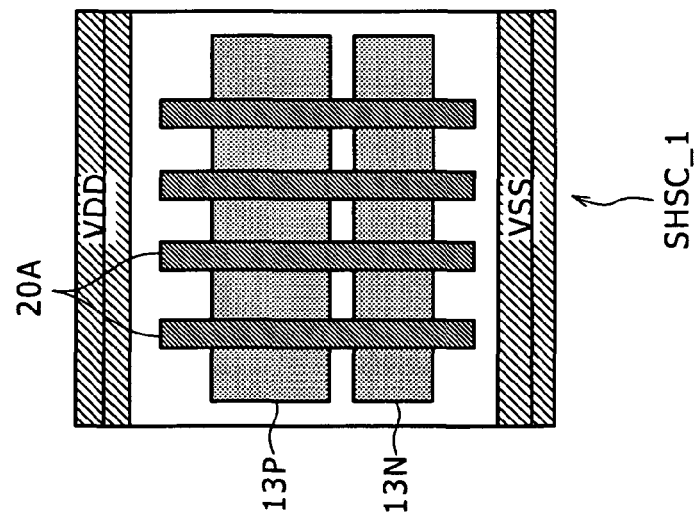

FIGS. 2A to 2C illustrate three types of single height standard cells designed by a single height layout technique to form a CMOS logic circuit.

Each of these single height standard cells SHSC_1, SHSC_2 and SHSC_3 has two doped regions, namely, a P-type doped region 13P and an N-type doped region 13N, arranged parallel to each other between the VDD and VSS lines. The P-type doped region 13P serves as the sources or drains of PMOS transistors. The N-type doped region 13N serves as the sources or drains of NMOS transistors. The reason for this is that the inverter is the basic building block of CMOS logic circuits. Polysilicon gate electrodes 20A and 20B forming an inverter input are arranged linearly so as to be orthogonal to a rectangular region including a P-type doped region 13P (hereinafter denoted by the same reference numeral as the P-type doped region 13P and referred to as the "PMOS active region 13P"). The polysilicon gate electrodes 20A and 20B are also arranged linearly so as to be orthogonal to a rectangular region including an N-type doped region 13N (hereinafter denoted by the same reference numeral as the N-type doped region 13N and referred to as the "NMOS active region 13N") (FIGS. 2A and 2C). Therefore, the single height standard cells have a height (standard cell length) appropriate to that of a complementary transistor pair (NMOS and PMOS pair).

In such a standard cell configuration, vertically long common gate electrodes of the complementary transistor pair (hereinafter the CMOS gate lines) are arranged side by side. This leads to an increased number of internal wirings adapted to connect CMOS gate lines or a CMOS gate line and other node (e.g., transistor source and drain). Moreover, because such a number of internal wirings must be provided in a limited space, the wiring pattern is inevitably complex. This leads to many vertices and bends in the metal and polysilicon layouts, thus resulting in a complex shape.

In leading-edge processes, the more complex the pattern shape is, the more design rule restrictions are imposed. Further, a complex pattern shape leads to a long time required to perform optical proximity correction (OPC) in the mask preparation or is disadvantageous from the viewpoint of design for manufacturing (DFM). Here, the term "DFM (design for manufacturing)" refers to a technique adapted to resolve the LSI manufacturing problems at the design stage. In the cell layout, a simple shape provides a device less susceptible to variations at the time of manufacture. Therefore, this aspect is important.

Further, difficulty in performing OPC, for example, may lead to a reduced yield of physical device.

The viewpoints described above constitute the first disadvantage of designing a logic circuit with only the single height standard cells SHSC.

A high likelihood of producing wasted space is the second disadvantage.

Standard cells used, for example, for a clock tree may be laid out with a changed size ratio between the PMOS and NMOS to ensure that the clock delay is the same. For example, a standard cell (SHSC_2: FIG. 2B) may be used that has a larger-than-normal PMOS (SHSC_1: FIG. 2A). Alternatively, a standard cell (SHSC_3: FIG. 2C) may be used that has a smaller-than-normal NMOS.

In this case, enlarging the PMOS active region 13P horizontally leads to a vacancy in the NMOS transistor forming region as shown in FIG. 2B. Conversely, reducing the NMOS active region 13N vertically does not increase the area of the standard cell SC itself but leads to a reduced area usage efficiency. These constitute wasted spaces in exchange for necessary functions, which is one of the reasons why high density packaging cannot be achieved.

The embodiments of the present invention propose a complementary transistor pair (e.g., CMOS pair) standard cell configuration that resolves the above two disadvantages. The present invention is applied to a complementary in-phase driven standard cell of all the types of complementary transistor pair standard cells.

Three layout configuration examples of the complementary in-phase driven double height standard cells WHSC to which the present invention is applied will be shown below together with circuit examples.

First Application Example

Figure 3:
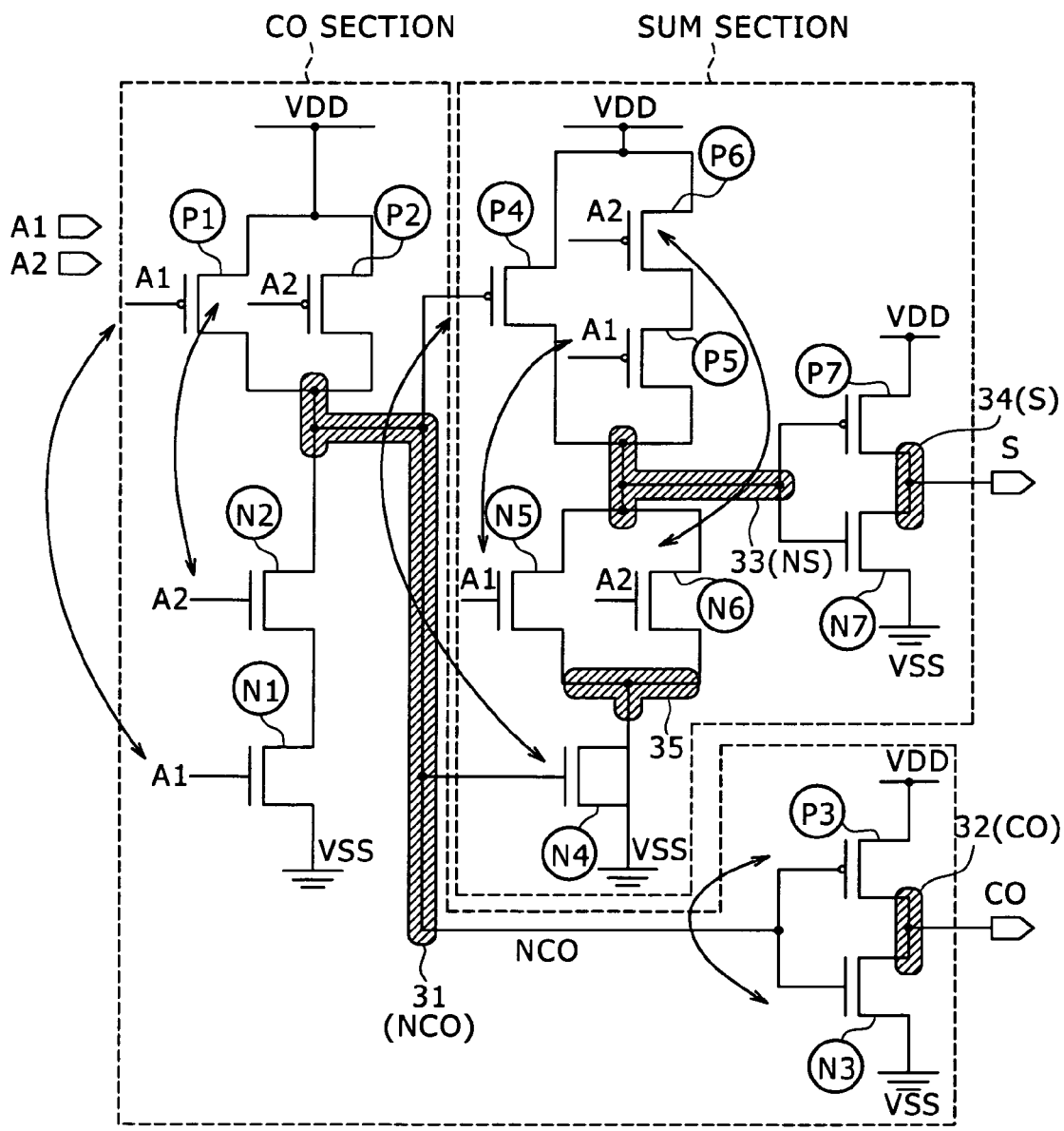
FIG. 3 is an equivalent circuit diagram of a first application example in the first embodiment.

FIG. 3 is an equivalent circuit diagram of a half adder cell as a circuit example of the standard cell SC to which the present invention is applied. The half adder shown in FIG. 3 is broadly divided into a carry-out section (CO section) and a single-bit addition section (Sum section). The half adder is a circuit designed to receive first and second input bits (A1 and A2) and output a half addition bit (S) and a carry-out bit (hereinafter the CO bit). The half addition bit represents the result of half addition in the first digit. The CO bit represents a carry.

It should be noted that the gates of the CMOS pairs that are supplied, for example, with the same input in FIG. 3 are indicated by bi-directional arrows.

The carry-out (CO) section includes a NAND circuit and an inverter. The NAND circuit includes two PMOS transistors P1 and P2 and two NMOS transistors N1 and N2. The inverter includes a PMOS transistor P3 and an NMOS transistor N3. The NAND circuit and inverter are connected by a wiring denoted by reference numeral 31 (internal wiring 31) where an inverted carry-out bit (NCO) appears. The P1-N1 CMOS pair is supplied with the first input bit A1. The P2-N2 CMOS pair is supplied with the second input bit A2.

The single-bit addition (Sum) section includes four PMOS transistors P4 to P7 and four NMOS transistors N4 to N7 and has the inverted carry-out bit (NCO) and the first and second input bits (A1 and A2) as its inputs. Although performing a single bit addition, the same section produces a single bit output. Therefore, the same section performs a half addition operation adapted to produce a "0" output with the help of the inverted carry-out bit (NCO) that is "0 (e.g., low level)" when both the first and second input bits A1 and A2 are "1 (e.g., high level)."

In such a configuration, when the two input bits (A1 and A2) are both low, the PMOS transistors P1 and P2 are ON. Therefore, the NCO is high, and the CO is low. As a result, no carry is generated. On the other hand, both the PMOS transistors P5 and P6 are ON. This pulls an inverted half addition bit (NS) up to high level. The NS is the potential of an internal connection line 33 forming the input node of the inverter at the final stage. As a result, an internal connection line 34 outputs a low level as the half addition bit (S).

When the two input bits (A1 and A2) are high and low, respectively, the PMOS transistor P1 is OFF but the PMOS transistor P2 is ON. Similarly, therefore, the NCO is high, and the CO is low. As a result, no carry is generated. On the other hand, both the NMOS transistors N4 and N5 are ON. This pulls the inverted half addition bit (NS) down to low level. Therefore, a high level is output as the half addition bit (S).

When the two input bits (A1 and A2) are low and high, respectively, the PMOS transistor P2 is OFF but the PMOS transistor P1 is ON. Similarly, therefore, the NCO is high, and the CO is low. As a result, no carry is generated. On the other hand, both the NMOS transistors N4 and N6 are ON. This pulls the inverted half addition bit (NS) down to low level. Therefore, a high level is output as the half addition bit (S).

When the two input bits (A1 and A2) are both high, the NMOS transistors N1 and N2 are ON, which stands in contrast to the above three cases. Therefore, the NCO is low, and the CO is high. As a result, a carry is generated. On the other hand, because the NCO is low, the PMOS transistor P4 is ON although the PMOS transistors P5 and P6, provided in parallel with the PMOS transistor P4, are OFF. This pulls the inverted half addition bit (NS) up to high level. Therefore, a low level is output as the half addition bit (S).

Figure 4:
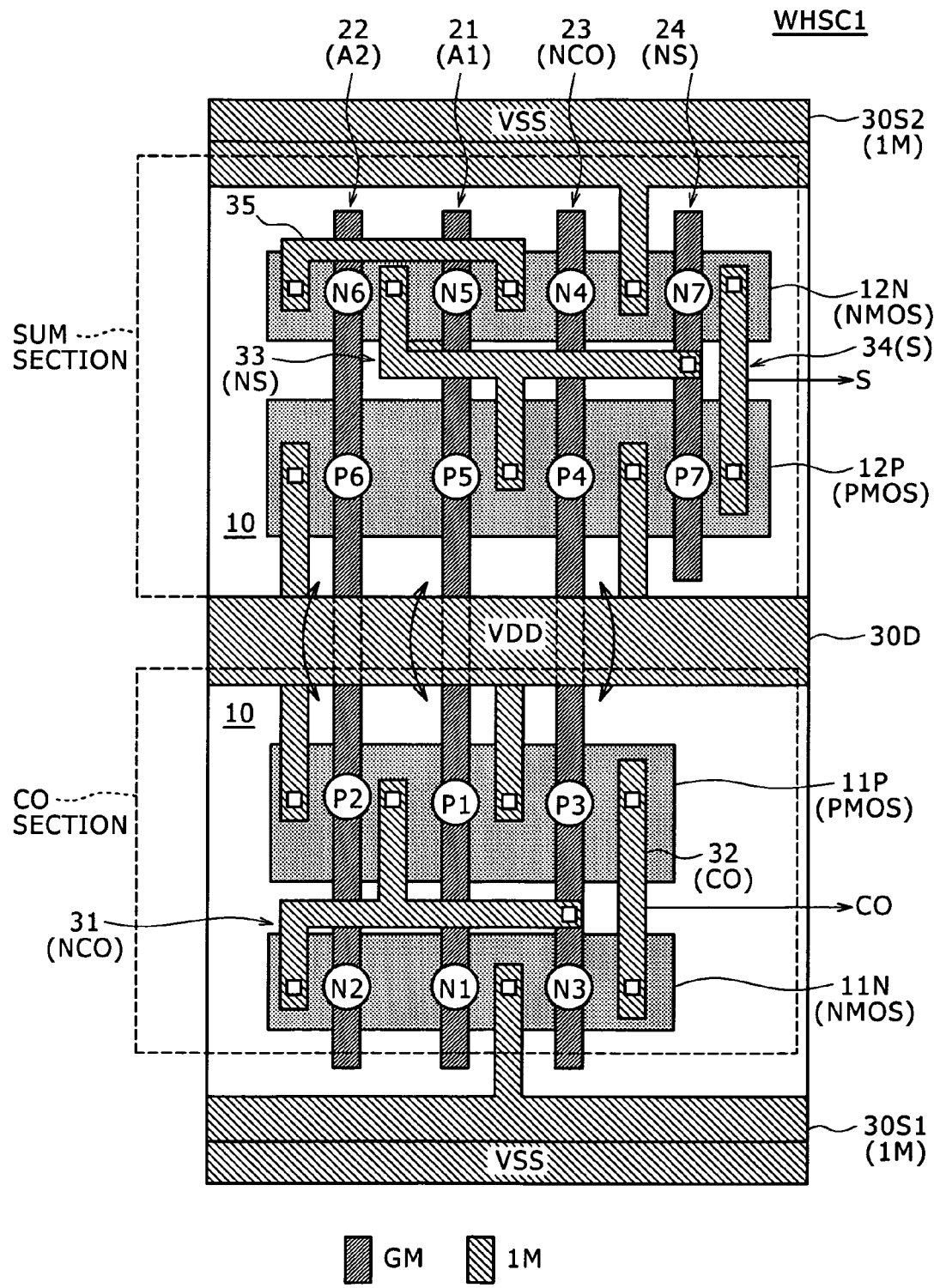
FIG. 4 is a first layout diagram of a first application example in the first embodiment.

FIG. 4 is a layout diagram of the circuit shown in FIG. 3 designed by applying an embodiment of the present invention.

The standard cell illustrated in FIG. 4 is an example of the double height standard cell WHSC1 (FIG. 1) having the VDD line disposed at the center.

In this double height standard cell WHSC1, a VDD line 30D extends in the arbitrary cell length direction (horizontal direction) at the center of the standard cell length direction (vertical direction). Further, two VSS lines, i.e., VSS lines 30S1 and 30S2, are disposed. The VSS line 30S1 is arranged along the center of the width of one of the short sides of the horizontal outer frame of the cell. The VSS line 30S2 is arranged along the center of the width of the other of the short sides thereof. The VSS lines 30S1 and 30S2 are arranged parallel to each other, and also parallel to the VDD line 30D. The VDD line 30D and VSS lines 30S1 and 30S2 are formed by patterning the first wiring layer (1M).

The circuit (CO section) adapted to generate the carry-out bit (CO bit) is provided on the lower half of the cell in such a manner as to have the VSS line 30S1 and share the VDD line 30D. On the other hand, the circuit (Sum section) adapted to generate the half addition bit (S) is provided on the upper half of the cell in such a manner as to have the VSS line 30S2 and share the VDD line 30D.

Two active regions of the same conductivity type, i.e., PMOS active regions 11P and 12P, are arranged line-symmetrically with respect to the center line of the power line (VDD line 30D) passing through the cell. Further, an NMOS active region 11N is arranged between the PMOS active region 11P and VSS line 30S1, and an NMOS active region 12N between the PMOS active region 12P and VSS line 30S2.

Surrounded by an element isolation insulating layer 10, these four active regions are isolated from one another and arranged to be horizontally long in shape and parallel to the power line.

It should be noted that the CO section has six transistors whereas the Sum section has eight. Therefore, the PMOS and NMOS active regions 12P and 12N are longer in shape than the NMOS and PMOS active regions 11N and 11P.

Three common gate electrodes 21 to 23 are arranged linearly in such a manner as to penetrate the four active regions vertically (in the standard cell length direction).

The common gate electrode 21 serves as a common gate of the transistors (P1, N1, P5 and N5) adapted to receive the first input bit A1 shown in FIG. 3. The positions of the above transistors are shown in FIG. 4 by the same reference numerals.

The common gate electrode 22 serves as a common gate of the transistors (P2, N2, P6 and N6) adapted to receive the second input bit A2 shown in FIG. 3. Further, the common gate electrode 23 serves as a common gate of the transistors (P3, N3, P4 and N4) adapted to receive the inverted carry-out bit shown in FIG. 3. The positions of the above transistors are also shown in FIG. 4 by the same reference numerals.

On the other hand, a common gate electrode 24 for the remaining two transistors (P7 and N7) is shorter than the other three and penetrates the PMOS and NMOS active regions 12P and 12N because the two transistors must receive the inverted half addition bit (NS) in the Sum section.

Internal wirings 31 to 35 shown in FIG. 3 are provided as the wirings of the first wiring layer (1M) and shaped as shown in FIG. 4 to connect the sources, drains and gates of different transistors. The specific connection relationship is obvious with reference to FIG. 3, and therefore is omitted.

[Characteristics of the Layout to Which the Present Invention is Applied]

A first characteristic of the layout is that the connection rule with the single layout power line arrangement is maintained. That is, the relationship between the VSS line 30S1 and VDD line 30D and that between the VSS line 30S2 and VDD line 30D are appropriate to the standard cell length of the single height standard cell SHSC (FIG. 1). These relationships allow for power lines to be shared between a single height cell and double height cell when they are arranged adjacent to each other. For this reason, the double height standard cell WHSC1 has a standard cell length which is a plurality of or M ($\geq 2$, M=2 in this case) times the basic cell length which is the standard cell length of a single height cell.

A second characteristic of the layout is that the gate electrodes of the plurality of or M (M=2 in this case) complementary transistor pairs to be driven in phase are arranged linearly as common gate electrodes.

This commonization of gate electrodes contributes to a reduced number of internal wirings, thus providing leeway in the layout of other internal wirings. When there is leeway in the layout of internal wirings, wirings may be laid out without forming a complex shape, possibly contributing to improved yield and ease of manufacturing. Further, there is no need to connect the gates together using the upper layer wirings, thus providing leeway in the layout of the upper layer wirings. In the case of this circuit example in particular, there is no need to connect the gates together in the higher second wiring layer, as in the comparative examples which will be described later, thus ensuring effective use of multi-wiring resources and providing reduced cost.

A third characteristic of the layout is that active regions of the same conductivity type (11N and 12N) are arranged line-symmetrically with respect to (M−1) power lines passing midway therebetween, or the one VDD line 30D because M=2.

A fourth characteristic of the layout is that all the gate electrodes overlapping the portion of the element isolation insulating layer 10 located within the width of separation between the two active regions are the common gate electrodes 21 to 23 of the complementary transistor pairs to be drive in phase. In contrast, the common gate electrode 24 is not a common electrode of a plurality of complementary transistor pairs, but is instead a common electrode of NMOS and PMOS transistors in a single complementary transistor pair. Such an electrode does not overlap any portion of the element isolation insulating layer 10 located within the width of separation between the two active regions (instead overlaps the portion of the same layer 10 located outside the width of separation).

The fourth characteristic is obvious when we consider the case in which this characteristic is not present. That is, we assume that two gate electrodes, one extending from up to down and another extending from down to up into the width of separation between the two active regions, are separated within the same width. In this case, a space for separating the electrodes is required in addition to the alignment tolerance required to reliably align the gate electrodes with the active regions in consideration of the misalignment of the photomask. As a result, there are limits to reducing the space between the active regions.

In the case of the layout shown in FIG. 4 to which the present invention is applied, on the other hand, the gate electrodes are not separated. Therefore, there is no need to consider the tolerance in this portion, nor there is any need to provide a separation space. All what is required is a separation width for element separation. However, so long as this width is secured, it is possible to bring the two active regions close to each other to the extent possible, thus providing leeway in the standard cell length direction. Because the standard cell length is determined to be M times the basic cell length which is the standard cell length of a single height cell, the standard cell length can be changed only by reviewing the basic cell length. This leeway provides a larger channel width (commonly also called the gate length) in the determined standard cell length direction, thus contributing to a larger transistor size or providing leeway in the layout of other internal wirings. When there is leeway in the arrangement of internal wirings, wirings may be laid out without forming a complex shape, contributing to improved yield and ease of manufacturing.

The above characteristics are also available when triple or higher standard cells which will be described later are used.

A description will be given next of comparative examples to which the present invention is not applied to further clarify the effects of the above characteristics.

Comparative Example 1

Figure 5:
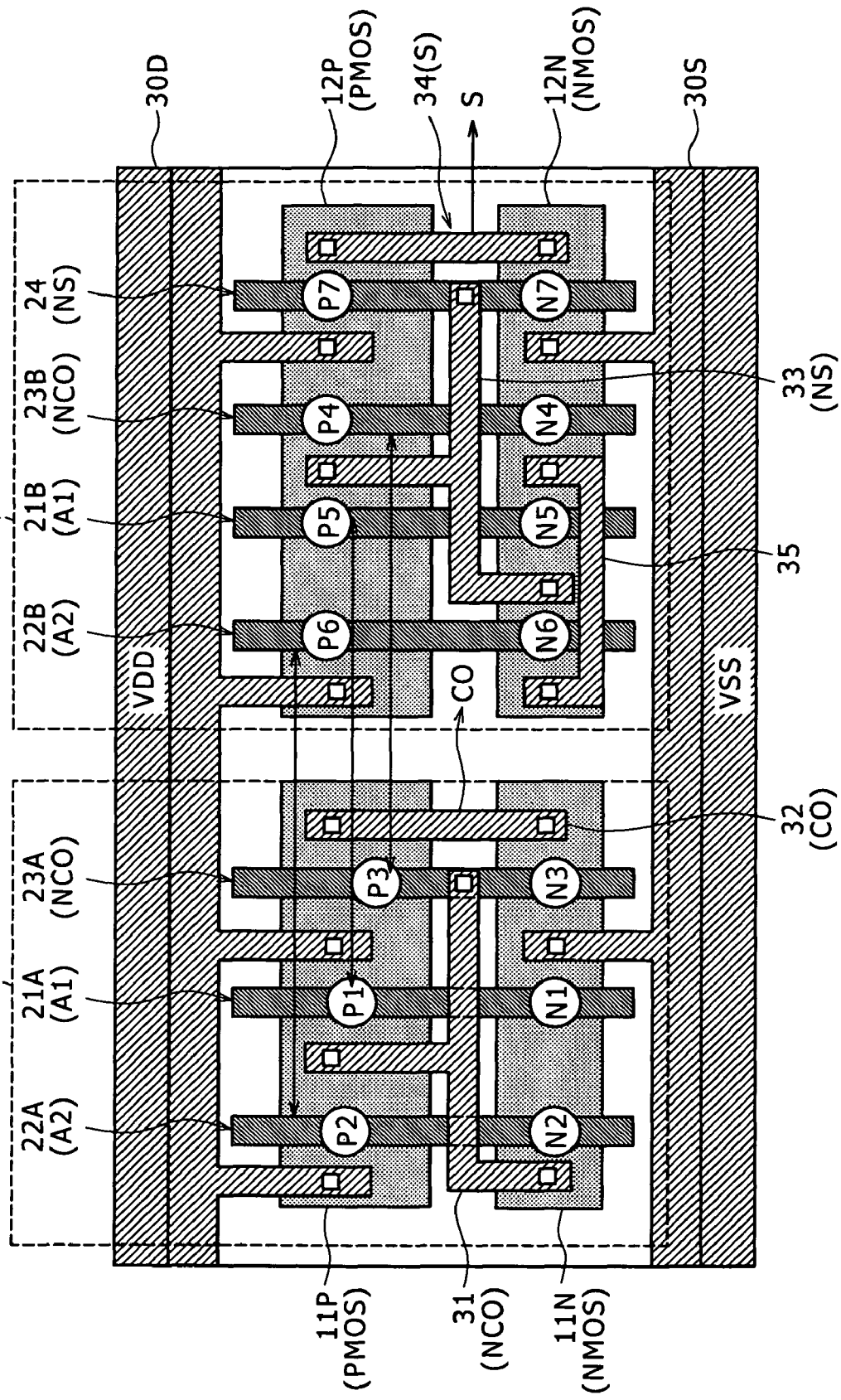
FIG. 5 is a layout diagram of comparison example 1 in the first embodiment.

FIG. 5 is a layout diagram of comparison example 1 in which the same circuit (FIG. 3) as shown in FIG. 4 is achieved with horizontally long single height cells.

The circuits shown in FIGS. 4 and 5 are basically extremely similar except for the commonization of gate electrodes. Like components are denoted by like reference numerals, and the description thereof is omitted.

In FIG. 5, the CO and Sum sections are arranged parallel to each other between the VDD line 30D and a VSS line 30S so that the CO and Sum sections can be supplied with power from these lines.

Further, while the single common gate electrode 21 is linearly arranged in FIG. 4, two common gate electrodes 21A and 21B, each for a CMOS pair, are arranged one on the left and the other on the right in FIG. 5. Similarly, while the single common gate electrode 22 is provided in FIG. 4, two common gate electrodes 22A and 22B are arranged one on the left and the other on the right in FIG. 5. Still similarly, while the single common gate electrode 23 is provided in FIG. 4, two common gate electrodes 23A and 23B are arranged one on the left and the other on the right in FIG. 5.

Because the two common gate lines are arranged separately, the pairs of gate electrodes shown by bi-directional arrows in FIG. 5 must be electrically shorted together.

A first approach to making these connections would be to achieve horizontal connections using the common gate electrodes themselves (gate polysilicon layer).

In order to short the common gate electrodes 21A and 21B together, it is necessary, for example, to expand the space between the PMOS active region 11P or 12P and VDD line 30D in the standard cell length direction. Further, in order to short the common gate electrodes 22A and 22B together, it is necessary, for example, to expand the space between the NMOS active region 11N or 12N and VSS line 30S in the standard cell length direction. Even in this case, the common gate electrodes 23A and 23B cannot be shorted together. As a result, it is inevitable that this remaining pair of common gate electrodes should be shorted together using the first wiring layer (1M).

With the first approach, the cell length must be expanded in the standard cell length direction so as to secure a space for arranging two common gate electrodes. However, this gives rise to significant wasted space in the standard cell array as a whole, which makes this approach unacceptable.

For this reason, a second approach would be to use the second wiring layer (2M).

If the branches for the active region contacts of the power lines (30D and 30S) and internal wirings (31 to 33) are moved backward in FIG. 5, it seems possible to secure a space for arranging the first wiring layer (1M) adapted to short out at least one common gate line. However, it is impossible in terms of space to connect all three. Therefore, at least one of them must use the higher second wiring layer (2M).

On the other hand, the connections between the first and second input bits A1 and A2 and half addition bit (S) and the unshown adjacent cell are not shown in FIG. 5. The second wiring layer (2M) may be used to make connections with the adjacent cell, which is, however, not necessary in the pattern shown in FIG. 5. The input and output lines of these three bits can be achieved by changing the pattern of the first wiring layer (1M).

Even in such a case, the layout shown in FIG. 5 which requires the use of the second wiring layer (2M) merely for connecting the common gate electrodes is disadvantageous in that it may result in significantly increased cost due to wasteful use of wiring resources.

As described above, both the first and second approaches are disadvantageous in that they are highly likely to result in significantly increased cost. The layout shown in FIG. 4 is superior to the comparative example shown in FIG. 5 in that it will not incur such a disadvantage.

It should be noted that the CO section shown in FIG. 4 has a vacant space which is not present in the CO section shown in FIG. 5. However, this vacant space exists in the arbitrary cell length direction. As is clear from FIG. 1, there are inherently many vacant spaces in the arbitrary cell length direction. Therefore, even if the size in the arbitrary cell length direction is increased as a result of the application of an embodiment of the present invention, the increased size will lead to no increase or an extremely slight, if any, increase in cost. If anything, the advantage gained by the application of the present invention, namely, the advantage that there is no need to expand the standard cell length or use the upper wirings more than offsets the disadvantage that the size in the arbitrary cell length direction is larger. Therefore, the application of the present invention is effective in reducing cost.

Further, as a result of an embodiment of the application of the present invention, the wiring pattern layouts for the first wiring layer (1M) and polysilicon are simpler in shape thanks to fewer vertices and bends. The application of the present invention is advantageous from the viewpoint of design for manufacturing (DFM) in that it contributes to reduced manhours for mask preparation including the OPC process and design, thus providing further reduced manufacturing cost and improved yield.

Second Application Example

Figure 6A:
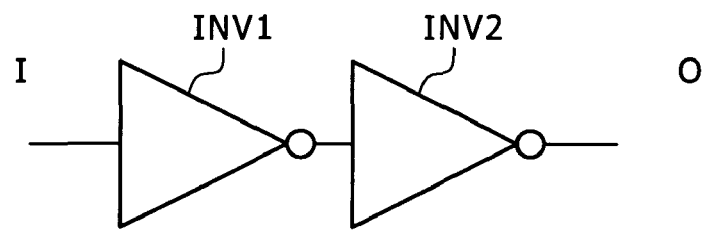
FIGS. 6A and 6B are equivalent circuit diagrams of a second application example in the first embodiment.
Figure 6B:
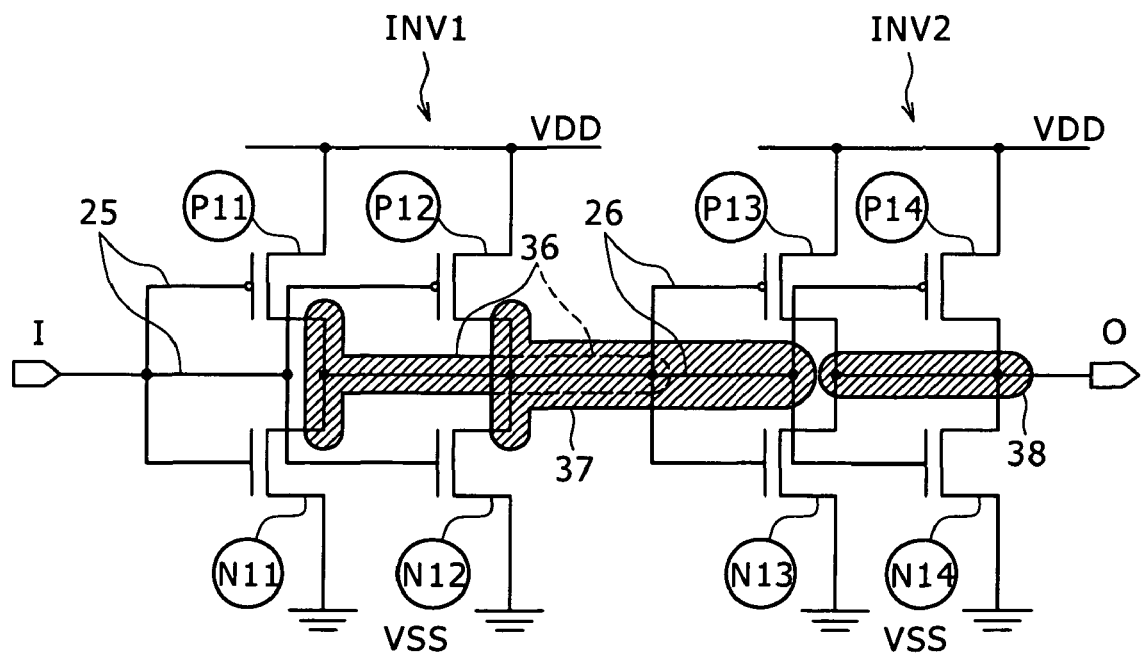

FIGS. 6A and 6B illustrate a circuit symbol and equivalent circuit diagram of a clock buffer cell.

A clock buffer cell is a cell including an even number of stages of cascaded inverters. This type of cell is designed so that the clock output from the cell has the same duty ratio to the extent possible. Therefore, a clock buffer is characterized in including larger-than-normal PMOS transistors or smaller-than-normal NMOS transistors.

A specific clock buffer circuit includes two cascaded inverters INV1 and INV2 shown in FIG. 6A. Each of the inverters INV1 and INV2 includes two inverters connected in parallel as shown in FIG. 6B. Thus, when each of the inverters INV1 and INV2 of the clock buffer at the first and second stages includes two inverters connected in parallel, the inverters offer sufficient driving capability. In addition, the present invention is more readily applicable to the clock buffer.

Figure 7:
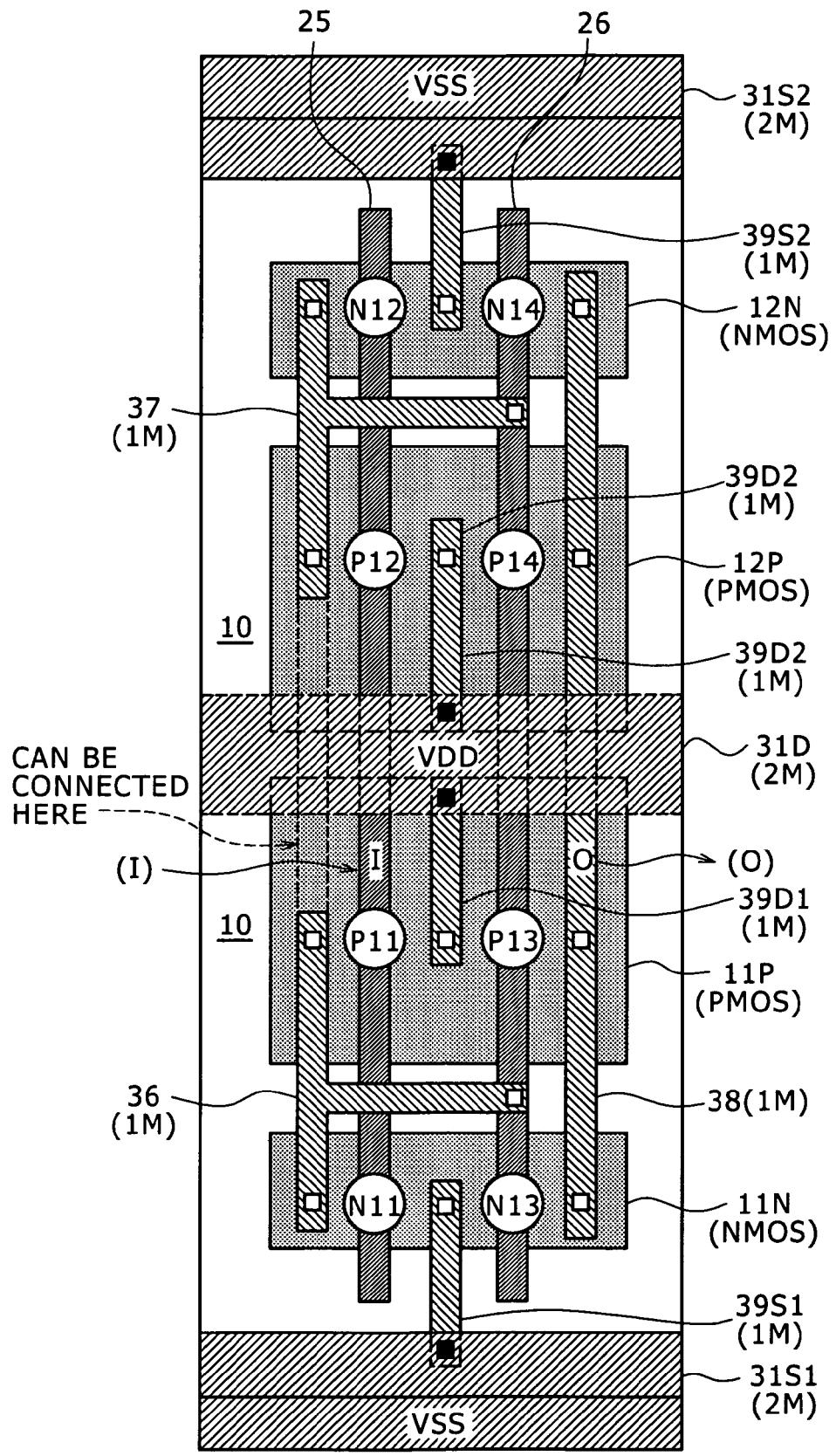
FIG. 7 is a first layout diagram of a second application example in the first embodiment.

FIG. 7 illustrates an example in which the circuit shown in FIG. 6 is laid out with a double height cell.

In this layout diagram, a VDD line 31D is arranged at the center of the standard cell length and extends in the arbitrary cell length direction. Two VSS lines 31S1 and 31S2 are arranged parallel to the VDD line 31D and along the center of the width of one of the short sides on both sides along the standard cell length. These three power lines are formed by using the second wiring layer (2M).

A specific description of the circuit configuration in the cell and the connections is omitted because the circuit itself is simple. Here, the element isolation insulating layer 10, PMOS active regions 11P and 12P, and NMOS active regions 11N and 12N are arranged in the same manner as in the first application example as like components as those in the first application example denoted by like reference numerals. Contact with the active regions is achieved by providing branches of the power lines in the first application example. Here, however, contact with the active regions is achieved by providing power connection lines 39D1, 39D2, 39S1 and 39S2 that are formed with the first wiring layer (1M).

Internal wirings 36 and 37 are formed with the first wiring layer (1M) to connect the inverters INV1 and INV2 together as shown in FIG. 6B. On the other hand, an internal wiring 38 is formed with the first wiring layer (1M) to serve as an output wiring of the inverter INV2. The same wiring 38 extends under the VDD line 31D in the standard cell length direction.

Common gate electrodes 25 and 26 are arranged parallel to each other and extend in the standard cell length direction as with the common gate electrodes 21 to 23 (FIG. 4) in the first application example. It should be noted that the CMOS pairs formed by these common gate lines are shown in the layout diagram of FIG. 7. These CMOS pairs are denoted by like reference numerals as those in FIG. 6B.

In this layout, PMOS transistors can be formed as far as in the region close to the VDD line which cannot be used in an ordinary single height cell, as with the layout in FIG. 4. Further, it is possible to design the layout with a simple wiring layer pattern without increasing the size in the standard cell length direction in the wiring layers up to the first wiring layer (1M). This makes it possible to increase the PMOS size without increasing the cell area or vacant spaces, thus providing a low-cost semiconductor integrated circuit with high yield.

Figure 8:
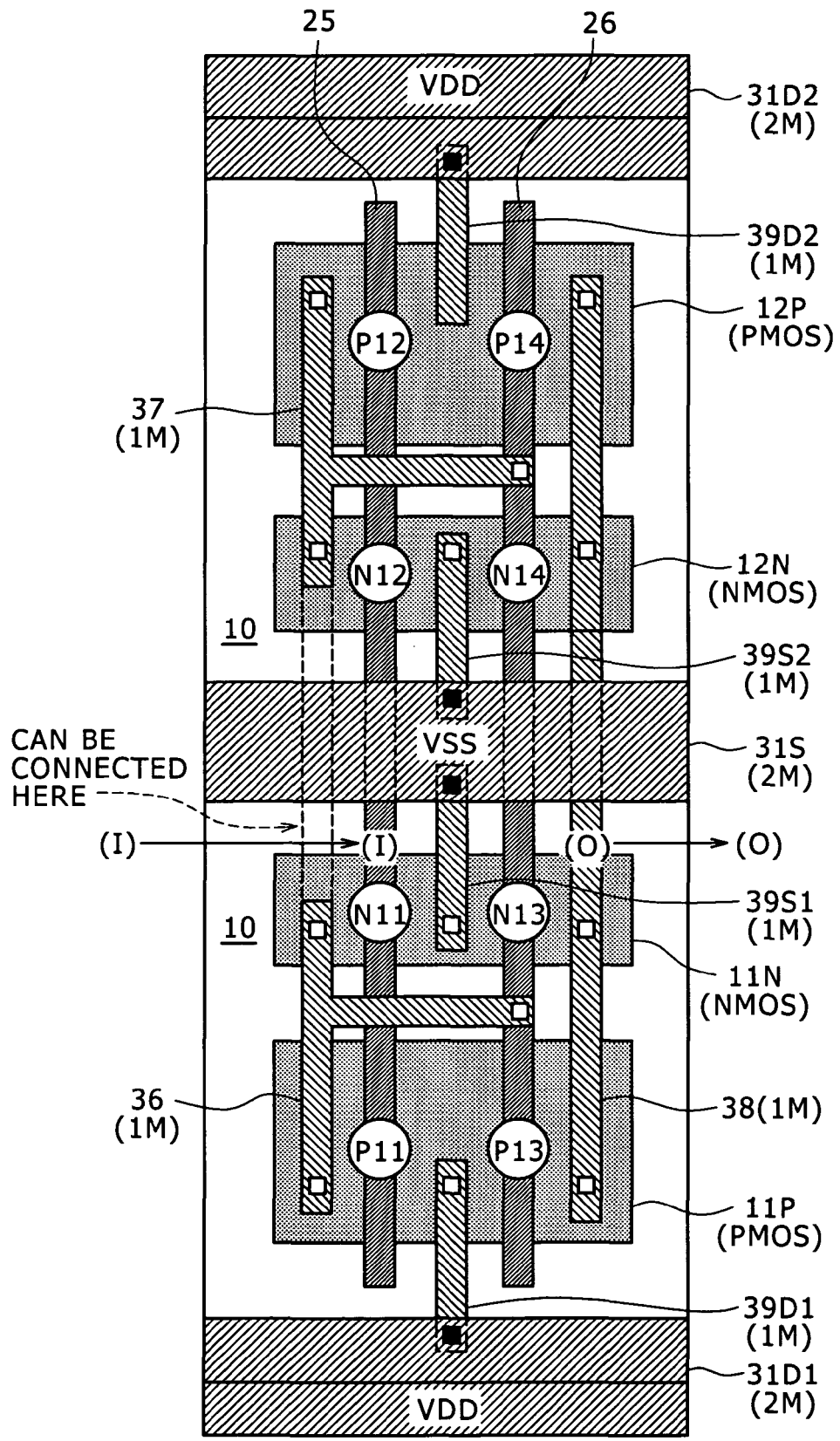
FIG. 8 is a second layout diagram of the second application example in the first embodiment.

FIG. 8 is a layout diagram of a cell having a VSS line 31S that is arranged at the center of the standard cell length and extends in the arbitrary cell length direction. This layout is also possible in the first application example shown in FIG. 4.

The cell shown in FIG. 8 differs from that shown in FIG. 7 in that the VSS line 31S is arranged at the center, and that VDD lines 31D1 and 31D2 are arranged along the short sides of the cell on both sides in the standard cell length direction. As a result, the layout of the NMOS and PMOS transistors in the standard cell length direction is opposite to that shown in FIG. 7. The cell shown in FIG. 8 is similar to that shown in FIG. 7 in all other respects.

Comparative Example 2

Figure 9:
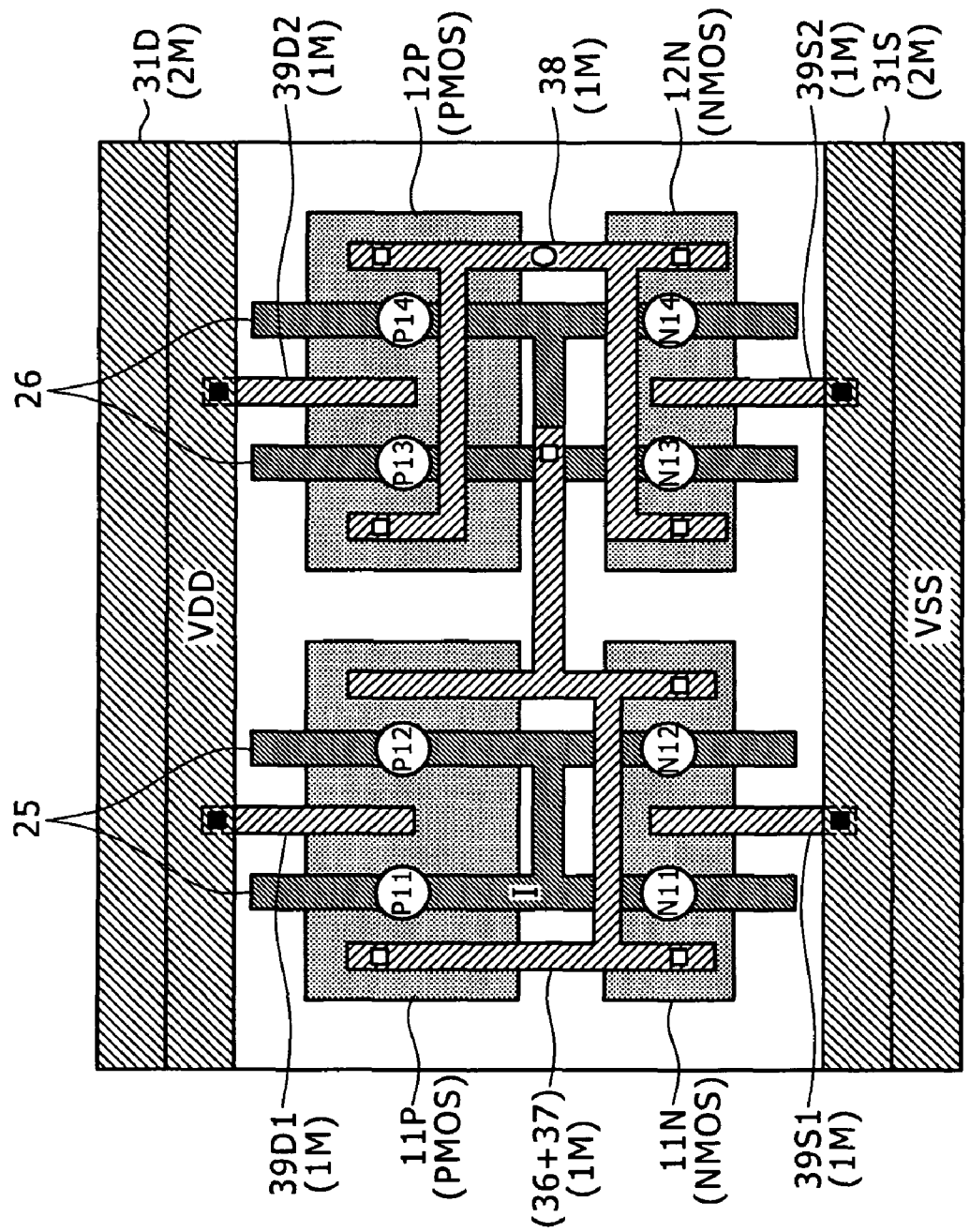
FIG. 9 is a layout diagram of comparative example 2 in the first embodiment.

FIG. 9 is a layout diagram of a cell that serves as a comparative example of those shown in FIGS. 7 and 8.

In the horizontal layout shown in FIG. 9, it is impossible to bring the PMOS active regions close to the VDD line as can be done in the cell shown in FIG. 7 and bring the NMOS active regions close to the VSS line as can be done in the cell shown in FIG. 8. The cell shown in FIG. 9 is disadvantageous in that the transistors are limited by the above two aspects and cannot be increased in size. Further, each of the common gate electrodes 25 and 26 is H-shaped. As a result, the same electrodes 25 and 26 are disadvantageous in that they require a larger layout area in the arbitrary cell length direction than the same electrodes 25 and 26 in linear shape shown in FIGS. 7 and 8. Moreover, an internal wiring denoted by reference numeral 36+37 that serves the purpose of the internal wirings 36 and 37 shown in FIGS. 7 and 8 and the internal wiring 38 are complex in shape. Because of these reasons, this cell has a larger size in the arbitrary cell length direction. Moreover, it is difficult to perform the OPC process when the cell is miniaturized. As a result, it is highly likely that the yield will decline.

In other words, the cell layouts shown in FIGS. 7 and 8 to which the present invention is applied resolve the disadvantages of the cell layout shown in FIG. 9.

Third Application Example

Figure 10:
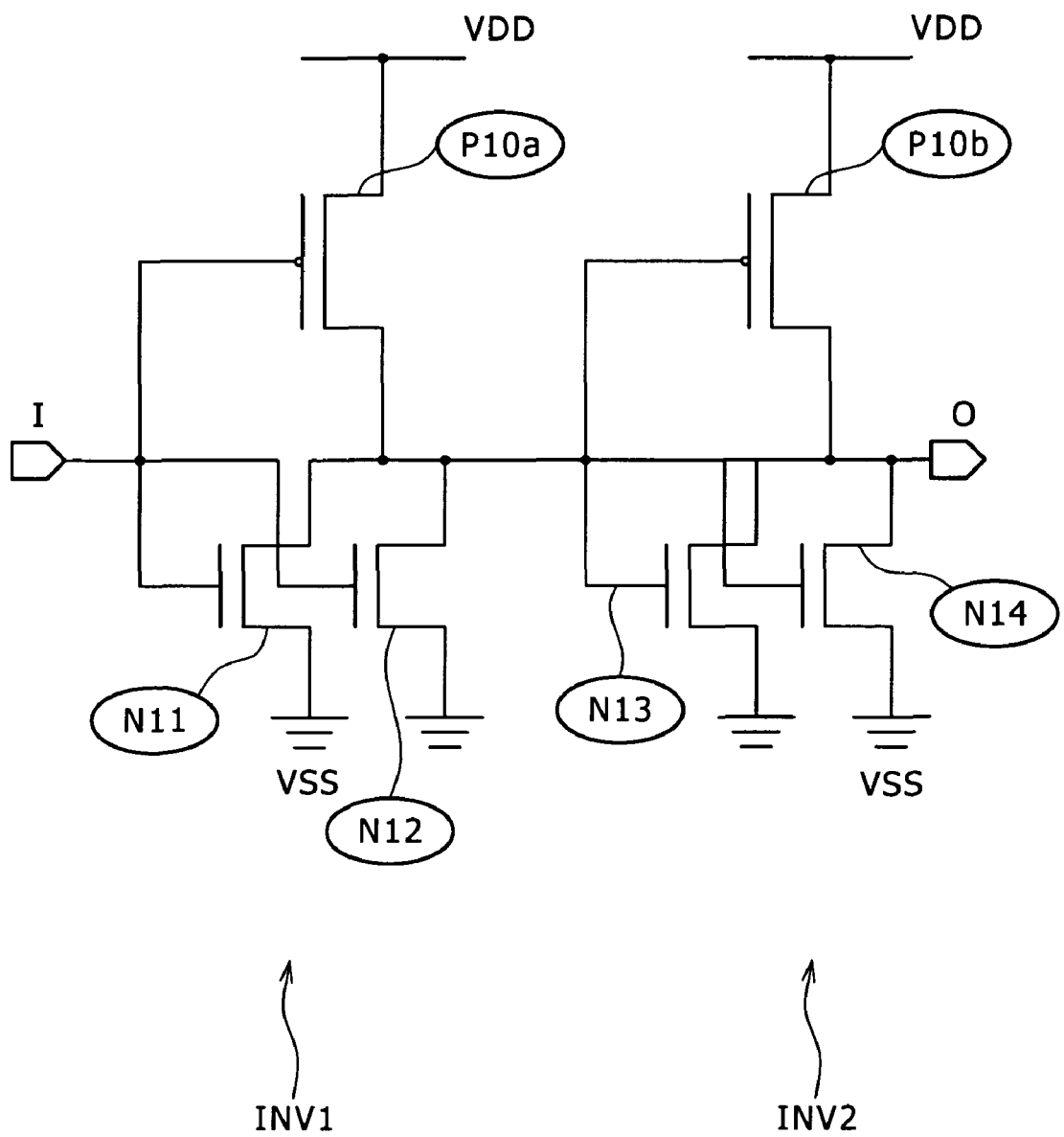
FIG. 10 is an equivalent circuit diagram of a third application example in the first embodiment.

FIG. 10 illustrates an equivalent circuit diagram of a third application example according to the modification of the second application example.

As compared to the clock buffer shown in FIG. 6B, that shown in FIG. 10 has a large PMOS transistor P10a rather than the two PMOS transistors P11 and P12 provided in the inverter INV1 shown in FIG. 6B. The same holds true for the inverter INV2. That is, the clock buffer shown in FIG. 10 has a large PMOS transistor P10b rather than the two PMOS transistors P13 and P14 shown in FIG. 6B.

Figure 11:
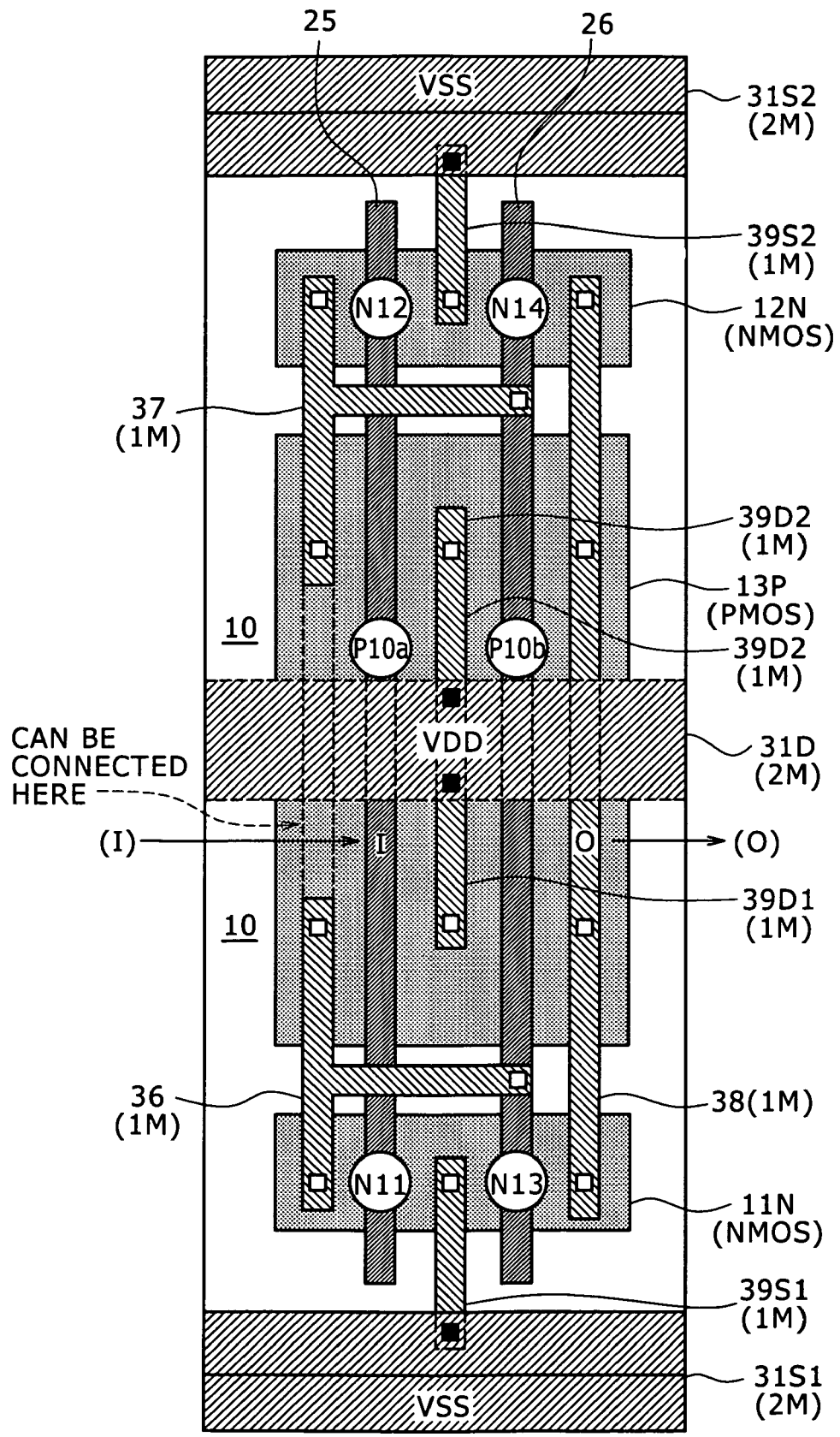
FIG. 11 is a layout diagram of the third application example in the first embodiment.

FIG. 11 illustrates a plan view of a cell that achieves the circuit shown in FIG. 10.

The comparison of the cells shown in FIGS. 7 and 11 reveals that the two separate PMOS active regions 12P and 11P in FIG. 7 are replaced by a single vertically long PMOS active region 13P in FIG. 11. This eliminates the need for an isolation region (part of the element isolation insulating layer 10) between the active regions required in FIG. 7, thus making it possible to increase the sizes of the PMOS transistors. Alternatively, if the PMOS transistors are maintained in the same size, it is possible to increase the sizes of the NMOS transistors.

It should be noted that the cell shown in FIG. 11 can be modified in the same manner as the cell shown in FIG. 7 is modified to provide the cell shown in FIG. 8.

Fourth Application Example

Figure 12A:
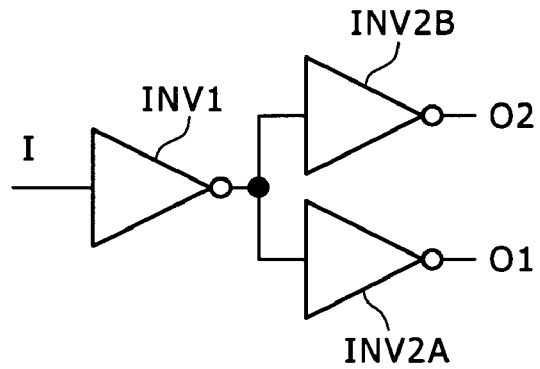
FIGS. 12A and 12B are equivalent circuit diagrams of a fourth application example in the first embodiment.
Figure 12B:
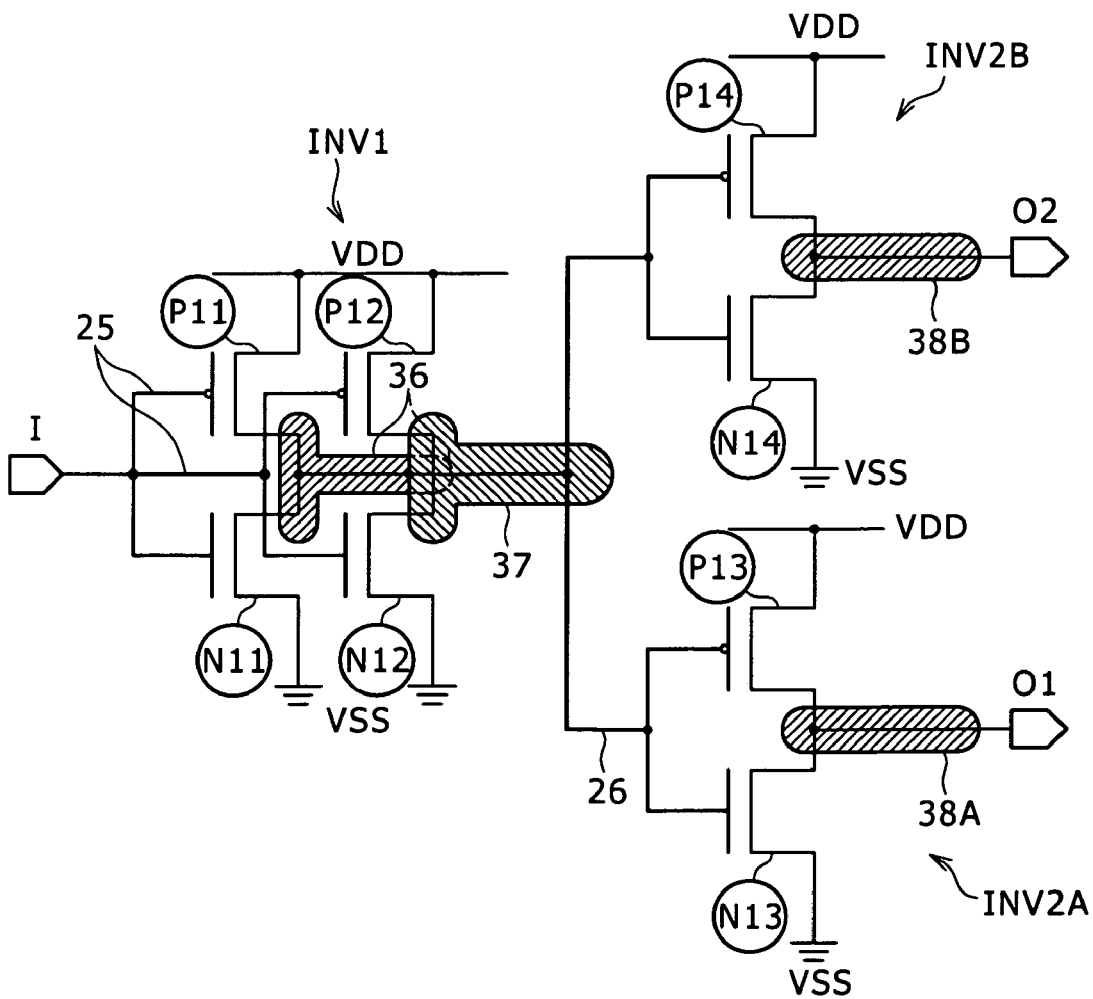

FIGS. 12A and 12B illustrate a circuit symbol and equivalent circuit diagram of a clock buffer cell capable of dividing the output into a plurality of branches as another modification example of the clock buffer cell shown in FIGS. 6A and 6B.

The circuit shown in FIGS. 12A and 12B differs from that shown in FIGS. 6A and 6B in that the inverter INV2 at the subsequent stage is divided into inverters INV2A and INV2B, each of which has an output node. In FIG. 12B, an internal wiring 38A making up the output node of the inverter INV2A and an internal wiring 38B making up the output node of the inverter INV2B are provided separately from each other. The circuit shown in FIGS. 12A and 12B is similar to that shown in FIGS. 6A and 6B in all other respects.

Figure 13:
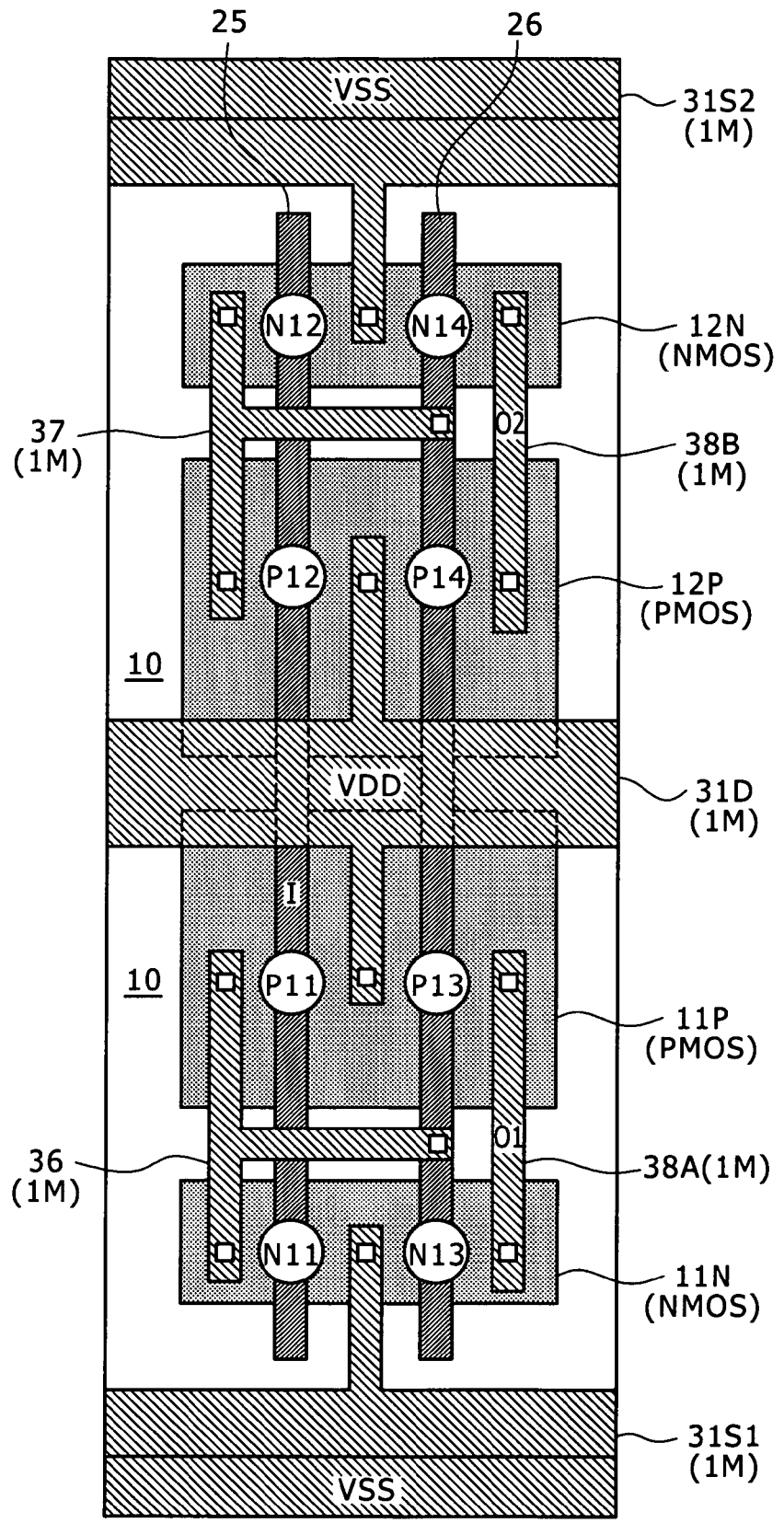
FIG. 13 is a layout diagram of the fourth application example in the first embodiment.

FIG. 13 illustrates an example in which the circuit shown in FIG. 12 is laid out with a double height cell.

In the clock buffer with branched outputs, the output node is separated into the internal wirings 38A and 38B. As a result, there is no need for the internal wiring of the output node to intersect the VDD line 31D at the center. This makes it possible to form the VDD line 31D (and VSS lines 31S1 and 31S2) with the first wiring layer (1M) as illustrated in FIG. 13. The connections between the power lines and active regions are achieved by the branch power lines extending from the main power lines. The circuit shown in FIG. 13 is similar to that shown in FIG. 7 in all other respects.

2. Second Embodiment

The second embodiment is a modification of the circuits shown in FIGS. 7 and 8 using a triple height cell that has a standard cell length that is three times the basic cell length.

Figure 14:
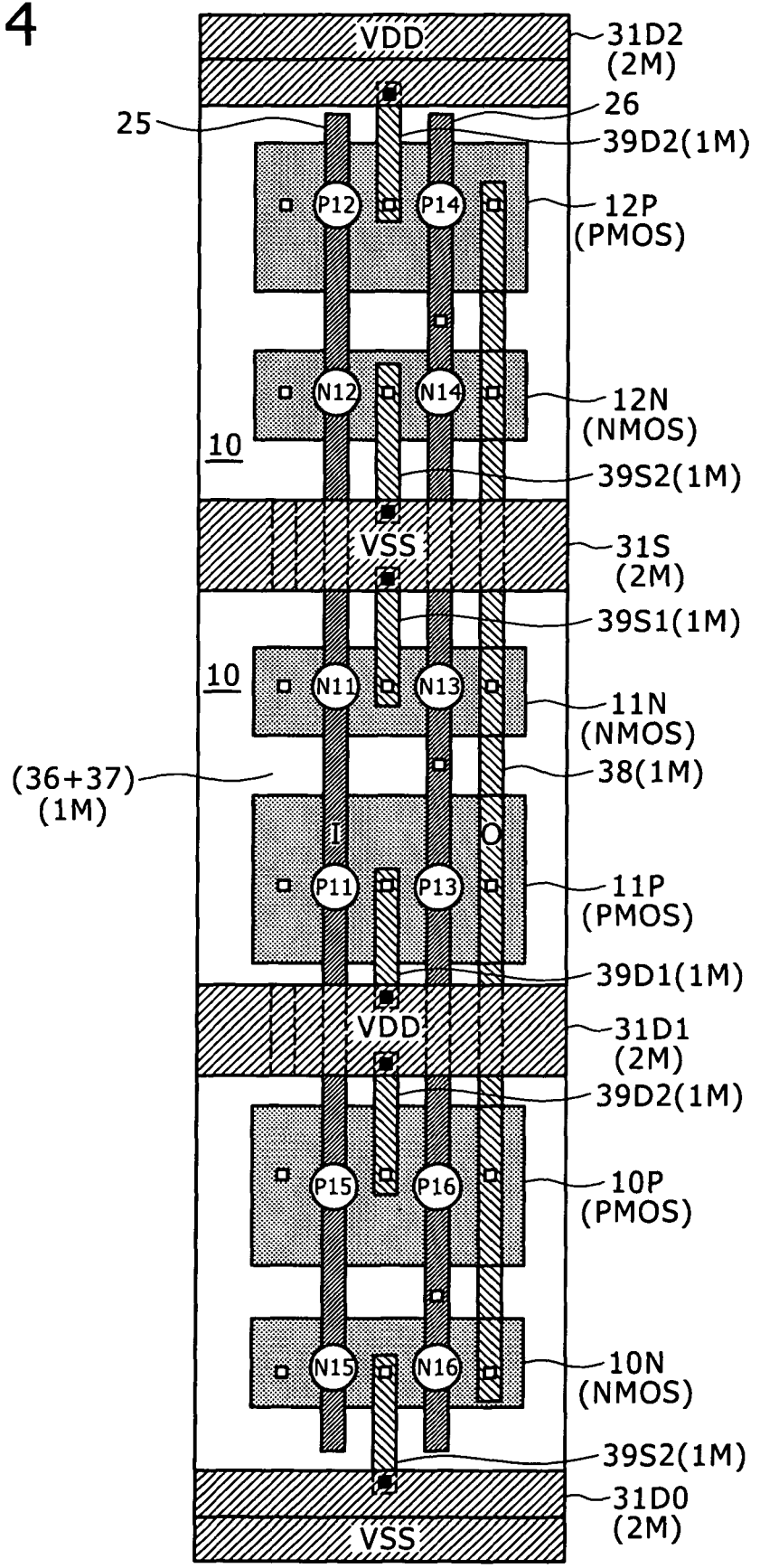
FIG. 14 is a layout diagram in a second embodiment.

FIG. 14 illustrates a layout diagram according to the second embodiment.

If, for example, the double height portion of the upper two stages in FIG. 14 is considered to be the same as the cell shown in FIG. 8, the lowermost stage portion is added to the cell shown in FIG. 8. Alternatively, if the double height portion of the lower two stages in FIG. 14 is considered to be the same as the cell shown in FIG. 7, the uppermost stage portion is added to the cell shown in FIG. 7. In FIG. 14, the additional portions are denoted by new reference numerals from the former viewpoint.

It should be noted that the equivalent circuit achieved by the layout diagram shown in FIG. 14 includes three parallel inverters in place of each of the inverters INV1 and INV2 shown in FIG. 6B.

In the additional portion, reference numeral 10P denotes a PMOS active region, and reference numeral 10N an NMOS active region. Further, a VSS line denoted by reference numeral 31D0 is added. The VDD lines 31D0 and 31D1 are provided respectively with the power connection lines 39S2 and 39D2 that are formed with the first wiring layer (1M). The same lines 39S2 and 39D2 are branch lines adapted to connect the NMOS active region 10N and PMOS active region 10P respectively to the power lines.

It should be noted that the internal wiring 36+37 is disposed to extend as long as the length of three basic cells. However, the internal wirings 36 and 37 can be similarly connected together to extend as long as the length of two standard cells in FIGS. 7 and 8. Therefore, this is not a special characteristic of a triple height cell.

Other components of the cell shown in FIG. 14 can be basically explained by analogy of the double height cells shown in FIGS. 7 and 8.

It should be noted that the corrections made by changing a double height cell to a triple height cell can be applied to multi-height cells equal to or greater than triple height cell using the same technique.

Still further, the advantages of a double height cell are similarly inherited by multi-height cells equal to or greater than triple height cell.

3. Third Embodiment

Multi-height cells equal to or greater than triple height cell can be used to produce a non-rectangular cell that is bent in the shape of L as a whole.

In a layout example according to the standard cell system as shown in FIG. 1, in general, there are likely many gaps in the arbitrary cell length direction. However, there is often not much leeway in space in the standard cell length direction. Therefore, if one wishes to increase the number of CMOS pairs as a whole while restricting the height in the standard cell length direction, this goal can be achieved by accommodating some of the CMOS pairs in the L-shaped bent portion in the arbitrary cell length direction. This solution often produces no wasted layout area.

The third embodiment is designed to meet such a need. The layout as shown in FIG. 15 can be, for example, used.

Figure 15:
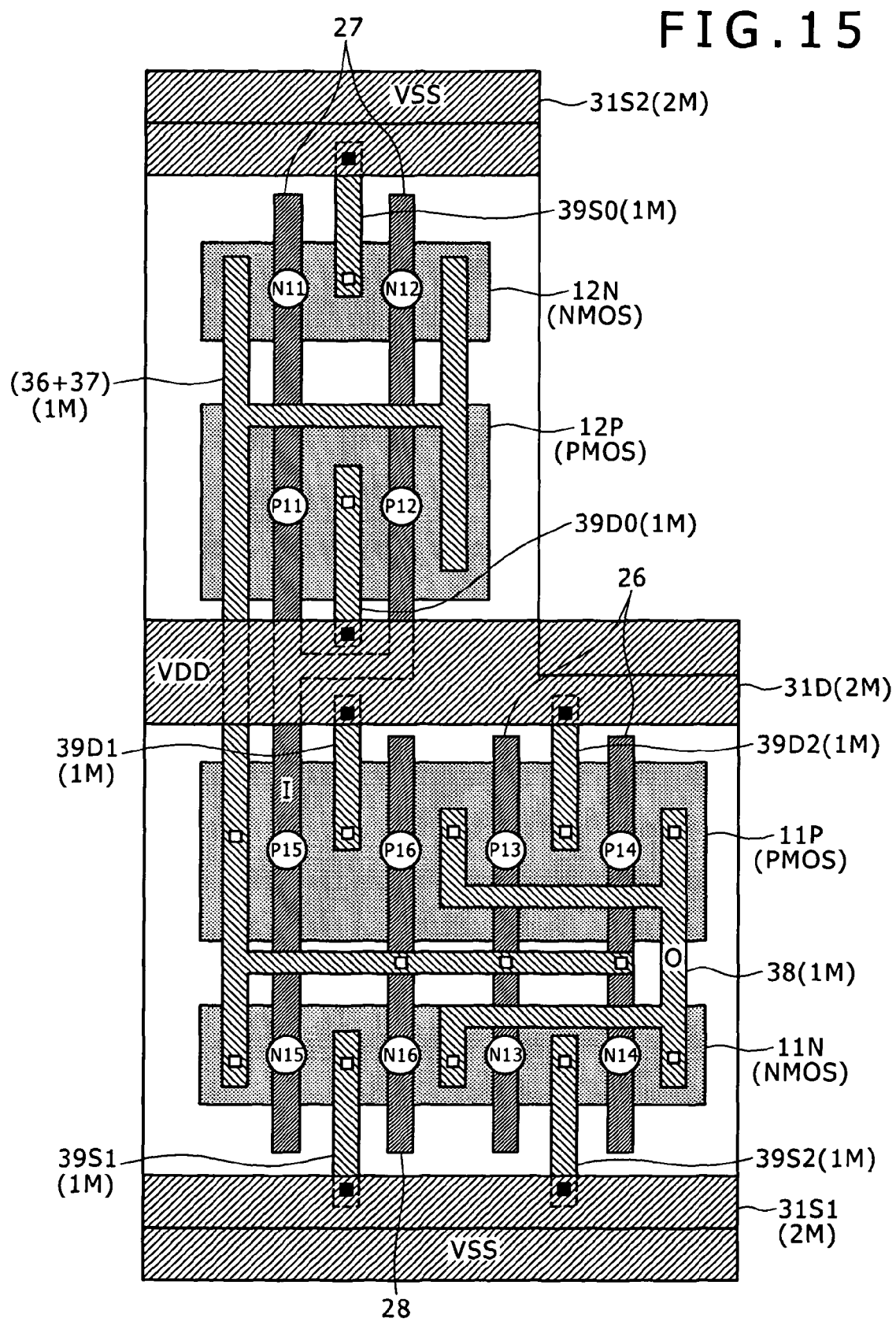
FIG. 15 is a layout diagram in a third embodiment.

In FIG. 15, a cell having three CMOS pairs as that shown in FIG. 14 is achieved by combining the layout of the double height cell shown in FIG. 7 and the layout the CMOS pairs on the right side of the single height cell shown in FIG. 9. It should be noted, however, that the two metal wiring layers shown in FIG. 9 are used. On the other hand, a common gate line denoted by reference numeral 27 has a shape in plan view that is divided into branches under the VDD line 31D for three CMOS pairs. These CMOS pairs make up three parallel inverters in the first stage. Three parallel inverters in the subsequent stage include three CMOS pairs formed by connecting a common gate electrode 28 and the H-shaped common gate electrode 26 (refer to FIG. 9) together with the internal wiring 36+37 that is formed with the first wiring layer (1M). In addition to the above, a power branch line connected to the NMOS active region 12N is denoted by reference numeral 39S0, and a power branch line connected to the PMOS active region 12P by reference numeral 39D0. All other components were already described with reference to FIGS. 7 and 9, and therefore the description thereof is omitted.

In the present embodiment, the functions of a triple height cell can be achieved with the standard cell height of a double height cell. This allows a greater degree of freedom in the layout, making it possible to choose between the layouts shown in FIGS. 14 and 15 according to the conditions surrounding the layout location when many triple height cells are laid out. This is significantly advantageous in that more efficient layout is possible. It should be noted, however, that the common gate line 27 is divided into branches where it intersects the VDD line 31D in FIG. 15. Therefore, the PMOS active regions 12P and 11P cannot be brought very close to the VDD line 31D. However, the layout shown in FIG. 15 has advantages that more than offset the above disadvantage, which makes this layout effective.

It should be noted that, including this third embodiment, the number of complementary transistor pairs to be driven in phase or N need not necessarily agree with the number of complementary transistor pairs or M that is appropriate to the standard cell length of multi-height layout. That is, a multi-height layout is possible that satisfies the relationship N≧M≧2.

4. Modification Examples

Modification examples of substrate contacts will be shown next.

In the first to third embodiments, substrate contacts are not shown in the layout diagrams.

Figure 16:
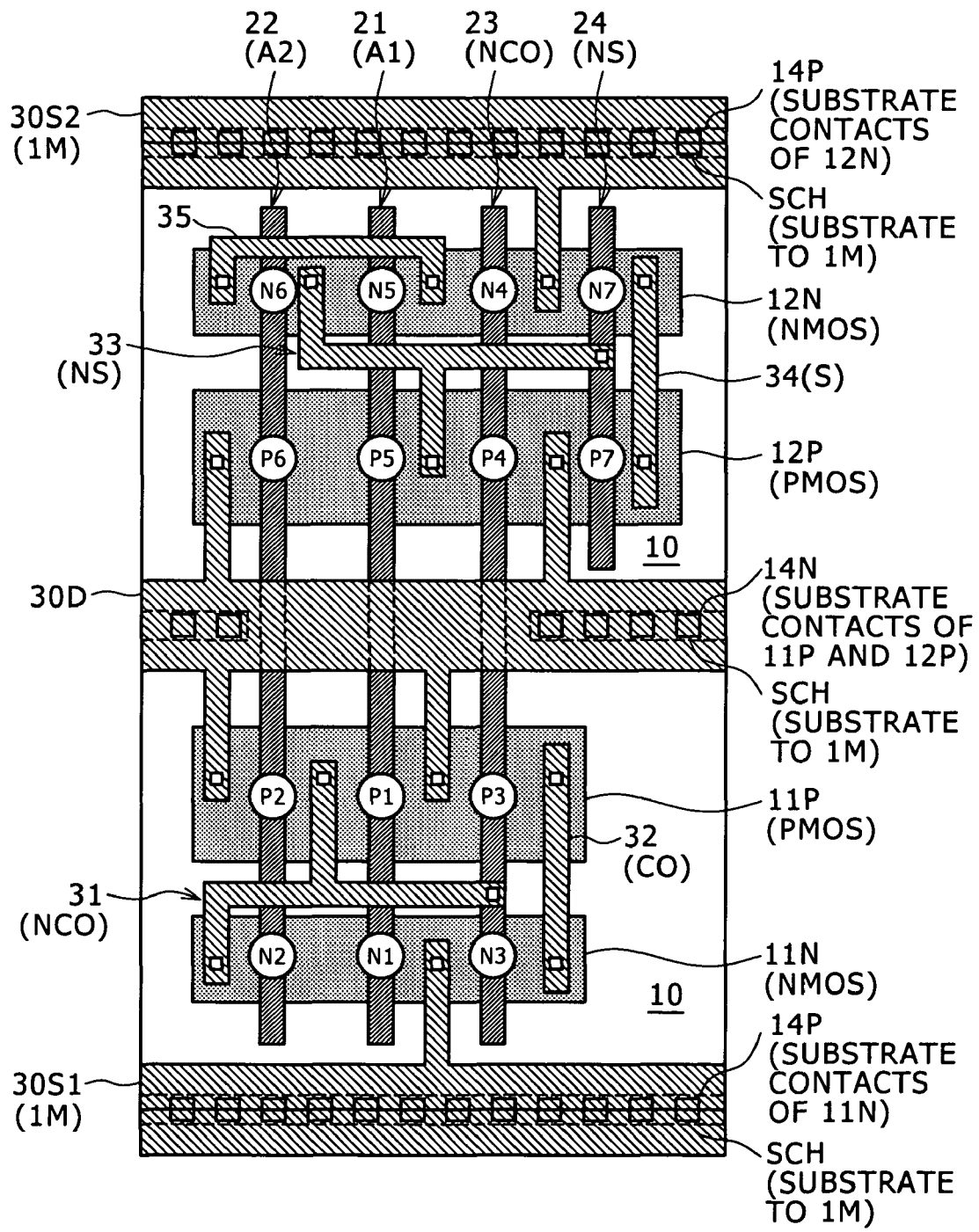
FIG. 16 is a first layout diagram of a modification example.
Figure 17:
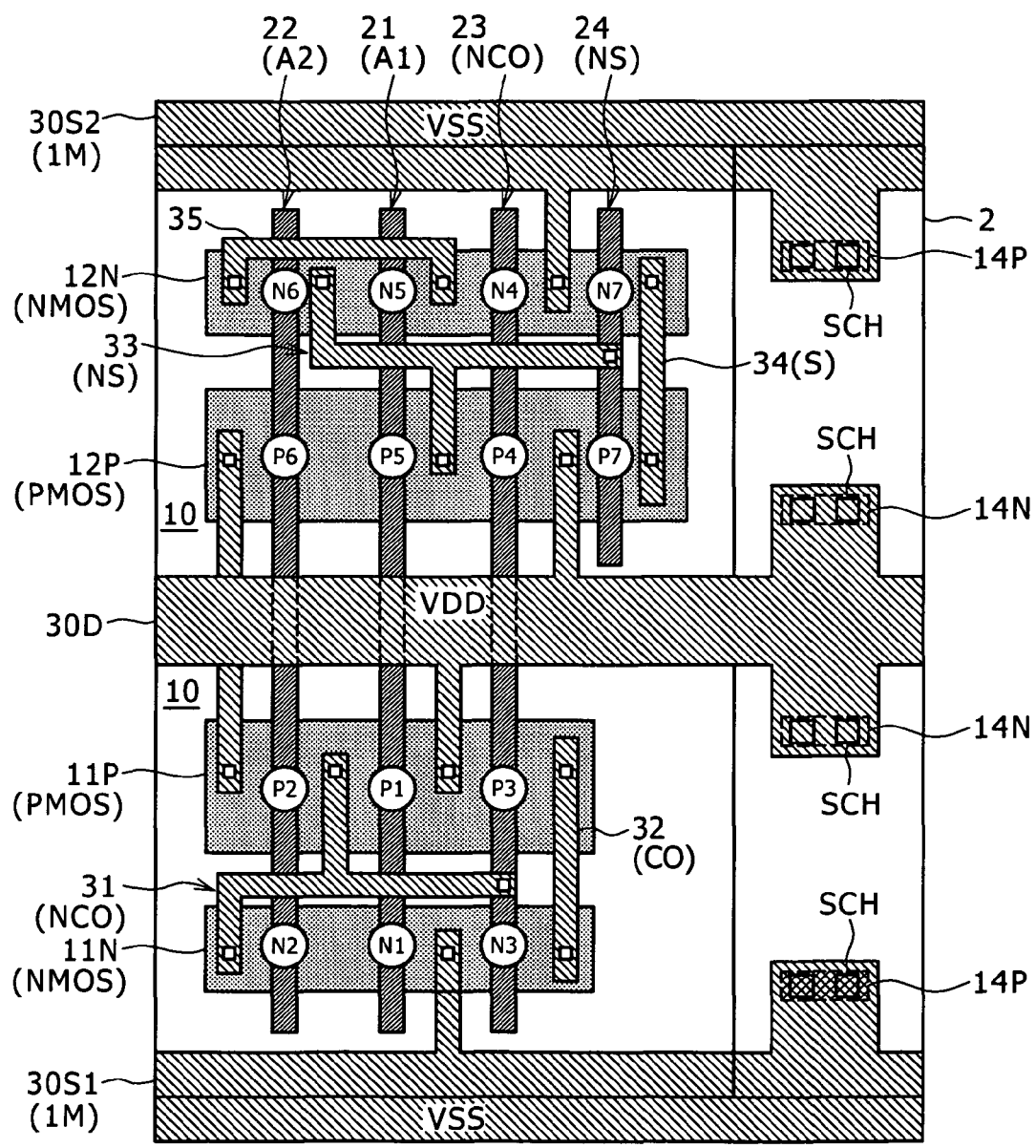
FIG. 17 is a second layout diagram of the modification example.

FIGS. 16 and 17 illustrate two examples of how to arrange substrate contacts. These figures illustrate in detail the substrate contact portions of the cell shown in FIG. 4. The same substrate contact layout technique is similarly applicable to the other layout diagrams.

Basically, in order to dispose gate polysilicon layer wirings (common gate lines) in the presence of substrate contacts SCH, the same contacts SCH and doped regions are removed, as appropriate only where the gate polysilicon layers are disposed. Here, the substrate contacts SCH are also referred to as taps. More specifically, an N-type doped region 14N that is higher in concentration is formed on the surface of the tap region where the PMOS active regions 12P and 11P and the element isolation insulating layer 10 are connected together in the deep side of the substrate. The substrate contacts SCH serve as connection plugs between the N-type doped region 14N and first wiring layer (1M). This allows for the channel forming regions of the PMOS transistors formed in the PMOS active regions 11P and 12P to be supplied with VDD voltage from the VDD line 30D. Further, the source region of the PMOS transistors is supplied with power by the branch from the VDD line 30D and the contacts connected to the branch.

On the other hand, many substrate contacts SCH are provided in the VSS lines 30S1 and 30S2 for the same purpose as above. The substrate contacts SCH in these areas are provided to connect the NMOS active region 11N or 12N to the VSS voltage. Strictly speaking, the channel forming region formed in the NMOS active region 11N or 12N or the substrate is connected to the VSS voltage. That is, a P-type doped region 14P that is higher in concentration is formed on the surface of the tap region where the NMOS active region 12N or 11N and the element isolation insulating layer 10 are connected together in the deep side of the substrate. The substrate contacts SCH serve as connection plugs between the P-type doped region 14P and first wiring layer (1M). This allows for the channel forming regions of the NMOS transistors formed in the NMOS active regions 11N and 12N to be supplied with VSS voltage. Further, the source region of the NMOS transistors is supplied with power by the branch from the VSS line 30S1 or 30S2 and the contacts connected to the branch.

Alternatively, a tapless circuit cell having none of the substrate contacts SCH (referred to as the taps) as shown in FIG. 17 may be used. In order to provide the substrate contacts SCH not provided by the tapless circuit cell, a tap cell 2 is also used.

The tap cell 2 is laid out as appropriate in the gap formed as appropriate in the arbitrary cell direction shown in FIG. 1. Therefore, careful consideration is given to ensure that the layout of the circuit cell is not affected by the tap cell 2.

The first to third embodiments described above provide the following advantages.

Firstly, the number of horizontal (arbitrary cell length direction) metal wirings can be reduced, thus allowing for effective use of the metal wiring resources.

Secondly, increased wiring resources eliminate the need to use metal in the upper layers.

Thirdly, polysilicon gate wirings (common gate lines) are disposed where they would not exist if the present invention was not applied, thus eliminating the horizontal polysilicon gate wirings and providing increased wiring resources.

Fourthly, the polysilicon gate wirings are simpler in shape.

Fifthly, thanks to the polysilicon gate wirings that are simpler in shape, there is more layout area in the diffusion regions (active regions) or the layout is easier to do.

Sixthly, since the metal and polysilicon wirings and diffusion regions are easier to lay out, the geometries are no longer complex, which is effective from the viewpoint of design for manufacturing (DFM).

Seventhly, where a VDD line is shared in a multi-height cell, the PMOS size can be increased, thus providing improved transistor mounting area efficiency.

Similarly, where a VSS line is shared in a multi-height cell, the NMOS size can be increased, thus providing improved transistor mounting area efficiency also in this respect.

The above advantages are achieved by elaborately taking advantage of the fact that, in a CMOS circuit, a signal is commonly connected to the gate terminals of the paired PMOS and NMOS transistors. In the case of an inverter, for example, a signal is connected to the gate terminals of the CMOS pair. In the first to third embodiments, when the cell input signals and the intracell signals are connected to the gate terminals of a plurality of CMOS pairs, a multi-height cell is intentionally used to lay out these CMOS pairs vertically.

The present application contains subject matter related to that disclosed in Japanese Priority Patent Application JP 2009-198547 filed in the Japan Patent Office on Aug. 28, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor integrated circuit, wherein
a desired circuit is formed by combining and laying out a plurality of standard cells and connecting the cells together, of which the cell length, i.e., the gap between a pair of opposed sides, is standardized,
the plurality of standard cells forming the desired circuit include complementary in-phase driven standard cells, each of which includes a plurality of complementary transistor pairs that are complementary in conductivity type to each other and have their gate electrodes connected together, and N ($\geqq$2) pairs of all the complementary transistor pairs are driven in phase, and
the size of the standardized cell length of the complementary in-phase driven standard cell is defined as an M-fold cell length which is M (N$\geqq$M$\geqq$2) times the basic cell length which is appropriate to the single complementary transistor pair, and the common gate electrodes of at least M pairs of the N complementary transistor pairs to be driven in phase are arranged linearly in the direction of the M-fold cell length.

2. The semiconductor integrated circuit of claim 1, wherein single height cells or standard cells having the basic cell length and multi-height cells or the complementary in-phase driven standard cells having the M-fold cell length are arranged adjacent to each other to share power lines so as to form the desired circuit.

3. The semiconductor integrated circuit of claim 2, wherein the multi-height cell has a total of (M+1) power lines which is the sum of (M−1) power wirings that are arranged parallel to each other to extend in an arbitrary cell length direction orthogonal to the M-fold cell length with a separation pitch equal to the basic cell length obtained by dividing the M-fold cell length into M equal parts and two shared power wirings, each of which is shared with an adjacent cell at the center of the width of one of two cell boundaries, one on each side along the M-fold cell length,
the (M+1) power lines include source voltage lines and reference voltage lines that are alternately arranged, and
the single height cell connected to a pair of the source voltage line and reference voltage line arranged adjacent and parallel to each other is arranged adjacent to the multi-height cell in the arbitrary cell length direction.

4. The semiconductor integrated circuit of claim 3, wherein
two active regions of the same conductivity type where transistors are respectively formed are arranged line-symmetrically with respect to the center line of the width of each of the (M−1) power wirings, and
the common gate electrodes are arranged linearly to intersect each of one of the active regions, power wirings and the other of the active regions.

5. The semiconductor integrated circuit of claim 4, wherein
all the gate electrodes overlapping an element isolation region provided between the two active regions are the common gate electrodes extending from one of the two active regions to the other of the two active regions and intersecting the element isolation region.

6. The semiconductor integrated circuit of claim 3, wherein
the (M+1) power lines and all intracell connection lines are formed with a first metal wiring layer, and
intercell signal lines are formed with a second metal wiring layer.

7. The semiconductor integrated circuit of claim 2, wherein
the multi-height cell is a non-rectangular cell that surrounds the single height cell in an L-shaped manner by including first and second rectangular sections, the first rectangular section having the M-fold cell length in which M complementary transistor pairs of all the complementary transistor pairs to be driven in phase are arranged, and the second rectangular section extending along one of two sides that are opposed to each other in the direction of the standardized cell length of the first rectangular section.

8. The semiconductor integrated circuit of claim 1, wherein
a plurality of standard cells forming the desired circuit include at least one non-rectangular standard cell that is L-shaped as a whole in plan view by comprising first and second rectangular sections, the first rectangular section having the M-fold cell length in which M complementary transistor pairs of all the complementary transistor pairs to be driven in phase are arranged, and the second rectangular section extending along one of two sides that are opposed to each other in the direction of the standardized cell length of the first rectangular section.

* * * * *